(12) United States Patent
Ying et al.

(10) Patent No.: US 12,075,631 B2
(45) Date of Patent: *Aug. 27, 2024

(54) MAGNETIC RANDOM ACCESS MEMORY AND MANUFACTURING METHOD THEREOF

(71) Applicant: TAIWAN SEMICONDUCTOR MANUFACTURING COMPANY, LTD., Hsinchu (TW)

(72) Inventors: Ji-Feng Ying, Hsinchu (TW); Duen-Huei Hou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,625

(22) Filed: Apr. 24, 2023

(65) Prior Publication Data

US 2023/0269951 A1 Aug. 24, 2023

Related U.S. Application Data

(63) Continuation of application No. 17/316,406, filed on May 10, 2021, now Pat. No. 11,659,718, which is a
(Continued)

(51) Int. Cl.
*H10B 61/00* (2023.01)
*B82Y 25/00* (2011.01)
(Continued)

(52) U.S. Cl.
CPC ............ *H10B 61/22* (2023.02); *G11C 11/161* (2013.01); *H10N 50/01* (2023.02); *H10N 50/10* (2023.02);
(Continued)

(58) Field of Classification Search
CPC ....... H01L 27/228; H01L 43/02; H01L 43/08; H01L 43/10; H01L 43/12; G11C 11/161;
(Continued)

(56) References Cited

U.S. PATENT DOCUMENTS 7,379,280 B2 5/2008 Fukumoto et al.
7,420,786 B2 9/2008 Sugiyama et al.
(Continued)

OTHER PUBLICATIONS

Oikawa, T., et. al., "Microstructure and Magnetic Properties of CoPtCr—SiO2 Perpendicular Recording Media", IEEE Transactions on Magnetics, vol. 38, No. 5, Sep. 2002.
Office Action issued in U.S. Appl. No. 16/019,394, dated Jun. 6, 2019.
Final Office Action issued in U.S. Appl. No. 16/019,394, dated Oct. 2, 2019.
(Continued)

*Primary Examiner* — Allison Bernstein
(74) *Attorney, Agent, or Firm* — STUDEBAKER & BRACKETT PC

(57) ABSTRACT

A semiconductor device includes a magnetic random access memory (MRAM) cell. The MRAM cell includes a first magnetic layer disposed over a substrate, a first non-magnetic material layer made of a non-magnetic material and disposed over the first magnetic layer, a second magnetic layer disposed over the first non-magnetic material layer, and a second non-magnetic material layer disposed over the second magnetic layer. The second magnetic layer includes a plurality of magnetic material pieces separated from each other.

20 Claims, 29 Drawing Sheets

Related U.S. Application Data continuation of application No. 16/743,992, filed on Jan. 15, 2020, now Pat. No. 11,004,901, which is a continuation of application No. 16/019,394, filed on Jun. 26, 2018, now Pat. No. 10,541,269.

(51) Int. Cl.
  *G11C 11/16* (2006.01)
  *H10N 50/01* (2023.01)
  *H10N 50/10* (2023.01)
  *H10N 50/80* (2023.01)
  *H10N 50/85* (2023.01)

(52) U.S. Cl.
  CPC ............. *H10N 50/80* (2023.02); *H10N 50/85* (2023.02); *B82Y 25/00* (2013.01)

(58) Field of Classification Search
  CPC ................ B82Y 25/00; H01F 10/3286; H01F 10/3259; H01F 41/30
  See application file for complete search history.

(56) References Cited

U.S. PATENT DOCUMENTS

| | | |
|---|---|---|
| 7,432,574 B2 | 10/2008 | Nakamura et al. |
| 8,018,011 B2 | 9/2011 | Ranjan et al. |
| 2005/0254287 A1 | 11/2005 | Valet |
| 2007/0085068 A1 | 4/2007 | Apalkov et al. |
| 2008/0180991 A1 | 7/2008 | Wang |
| 2008/0225585 A1 | 9/2008 | Ranjan et al. |
| 2012/0212998 A1 | 8/2012 | Ranjan et al. |
| 2015/0228891 A1 | 8/2015 | Park et al. |

OTHER PUBLICATIONS

Notice of Allowance issued in U.S. Appl. No. 16/019,394, dated Nov. 21, 2019.
Office Action issued in U.S. Appl. No. 16/743,992, dated Sep. 18, 2020.
Notice of Allowance issued in U.S. Appl. No. 16/743,992, dated Jan. 12, 2021.
Notice of Allowance issued in U.S. Appl. No. 17/316,406, dated Jan. 10, 2023.
Non-Final Office Action issued in U.S. Appl. No. 17/316,406, dated Sep. 30, 2022.

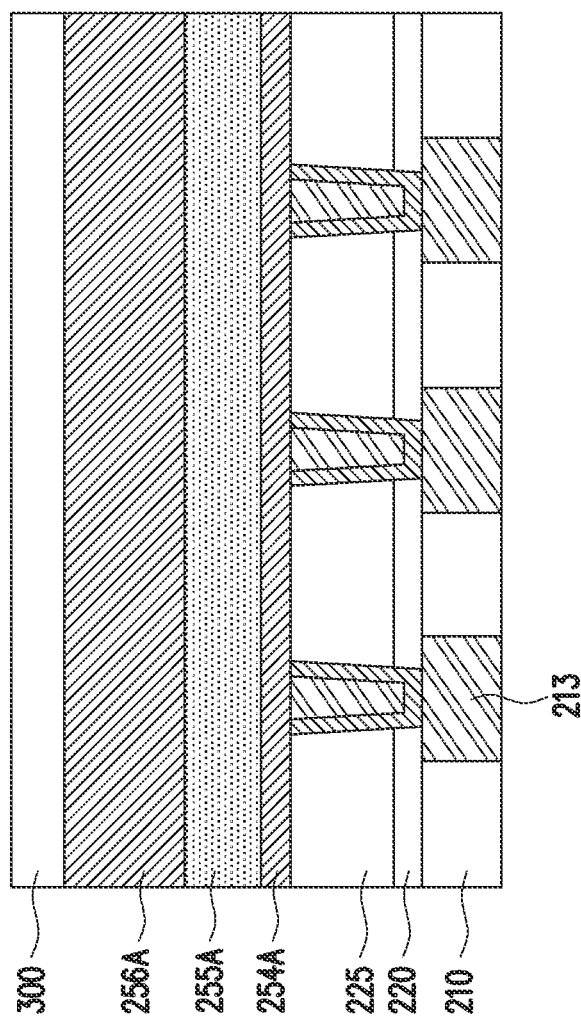

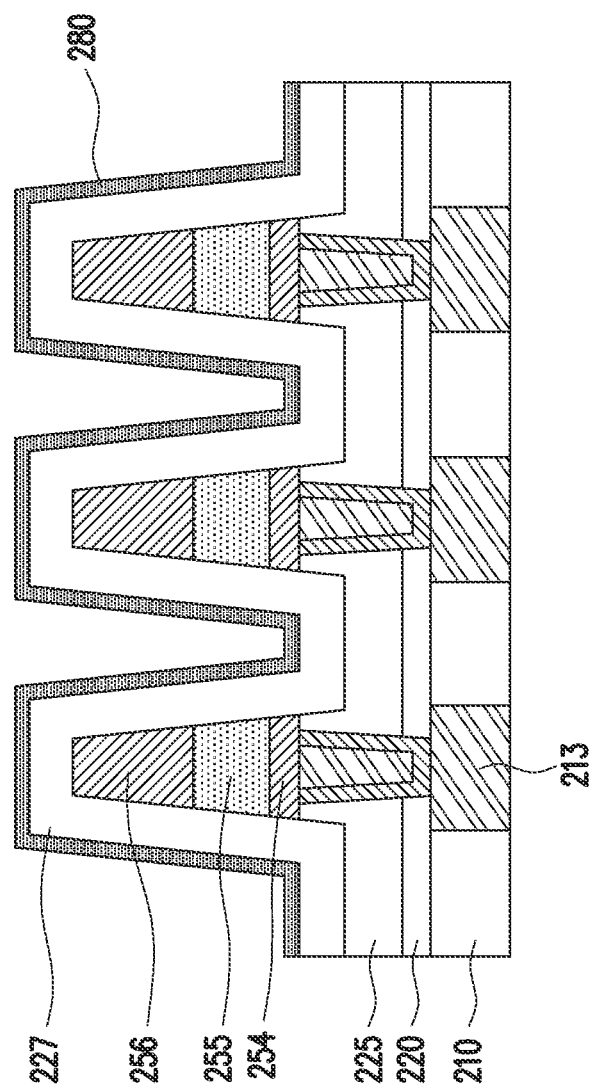

MAGNETIC RANDOM ACCESS MEMORY AND MANUFACTURING METHOD THEREOF

RELATED APPLICATIONS

This application is a Continuation of U.S. patent application Ser. No. 17/316,406 filed May 10, 2021, now U.S. Pat. No. 11,659,718, which is a Continuation of U.S. patent application Ser. No. 16/743,992 filed Jan. 15, 2020, now U.S. Pat. No. 11,004,901, which is a Continuation of U.S. patent application Ser. No. 16/019,394 filed Jun. 26, 2018, now U.S. Pat. No. 10,541,269, the entire contents of each of which are incorporated herein by reference.

TECHNICAL FIELD

The present disclosure relates to a magnetic random access memory (MRAM) device and, more particularly, to an MRAM device based on a magnetic tunnel junction cell formed with a semiconductor device.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

BRIEF DESCRIPTION OF THE DRAWINGS

FIGS. 11A and 11B show various stages of a sequential manufacturing process of the semiconductor device including an MRAM according to an embodiment of the present disclosure.

FIGS. 12A and 12B show various stages of a sequential manufacturing process of the semiconductor device including an MRAM according to another embodiment of the present disclosure.

DETAILED DESCRIPTION

Figure 1A:
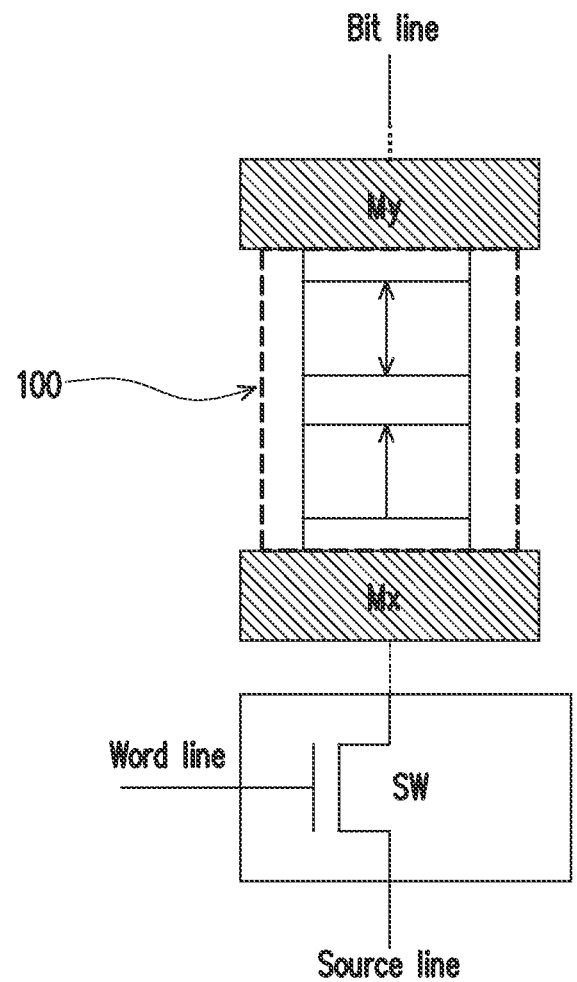
FIG. 1A is a schematic view of an MTJ MRAM cell according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

In an operation of MRAM devices, write current, write voltage and/or write power are key differential factors. As the devices scale down, the ability to supply driving current and voltage generally decreases. For mobile and many other applications, power consumption is also a key factor. The lower the write voltage, current and/or power, the more flexible the system design becomes, and the device performance is improved. The required current density to switch the free magnetic layer (Jc) and the resistivity of the free magnetic layer (Ra) are generally intrinsic properties relating to the composition, structure and the interfaces of the free magnetic layer. Therefore, reducing the write current, voltage and power may be achieved by engineering the composition, structure and interfaces of the free magnetic layer. However, it is quite difficult. Another key differential factor is the critical dimension (CD) of the MRAM devices. The smaller the CD, the higher the potential storage capacity becomes. When the free magnetic layer is ideally made as a continuous single layer of magnetic metal materials, the whole layer is considered to be one magnetic domain with the spins of whole layer strongly coupled together. In reality, it is unavoidable to have multiple domains in the free magnetic layer. Accordingly, in the MRAM devices, majority of the MRAM cells may have one domain, while some of the MRAM cells may have multiple domains in the free magnetic layer. The MRAM cells with multiple domains would cause tailing bits in the MRAM property distribution. With the CD shrinking, there will be more tailing bits in this category, with the tailing behavior more exacerbated, thus becoming an important roadblock for CD scaling.

In the present disclosure, the free magnetic layer has a segregated structure with a plurality of magnetic material pieces separated from each other. Instead of a continuous single layer of magnetic metal materials, segregated grains, isolated by a non-magnetic segregation layer, are used as the free magnetic layer.

Figure 1B:
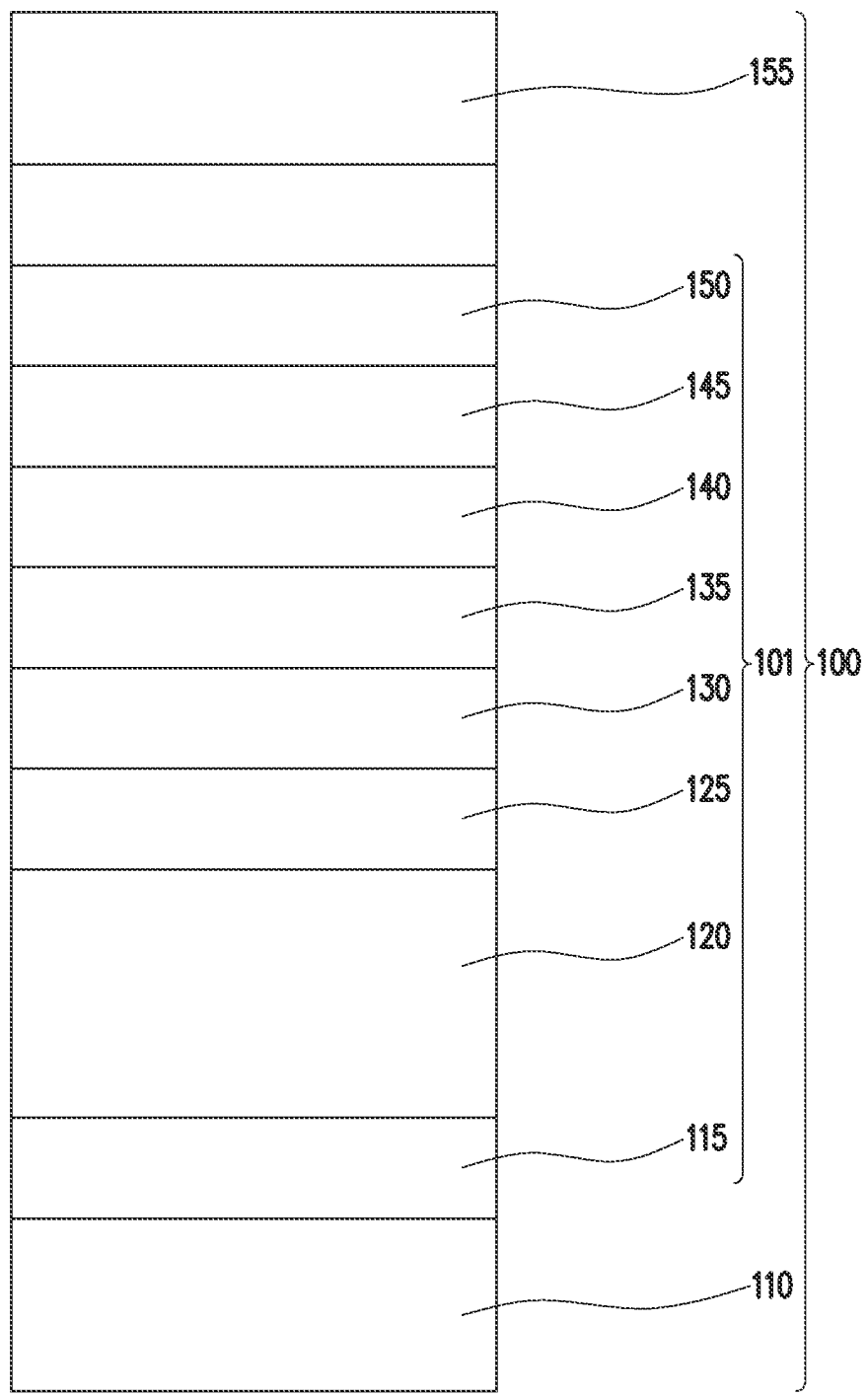
FIG. 1B is a schematic cross sectional view of the MTJ film stack according to an embodiment of the present disclosure.

FIG. 1A is a schematic view of an MTJ MRAM cell according to an embodiment of the present disclosure, and FIG. 1B is a schematic cross sectional view of the MTJ film stack. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. The upper metal layer My is coupled to a bit line. In some embodiments, the switching device SW is disposed between the upper metal layer My and the bit line.

The MTJ film stack 100 shown in FIG. 1B includes a first electrode layer 110 coupled to the lower metal layer Mx and a second electrode layer 155 coupled to the upper metal layer My. An MTJ functional layer 101 is disposed between the first electrode layer 110 and the second electrode layer 155.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 includes magnesium oxide (MgO) having a thickness in a range from about 0.5 nm to about 1.2 nm.

The MTJ functional layer 101 further includes an antiferromagnetic layer 125, as shown in FIG. 1B. The antiferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 and a second pinned magnetic layer 130 both including one or more magnetic materials, as shown in FIG. 1B.

The first electrode layer 110 is formed on the lower metal layer Mx made of, for example, Cu, Al, W, Co, Ni, and/or an alloy thereof, and the upper metal layer My made of, for example, Cu, Al, W, Co, Ni, and/or an alloy thereof, is formed on the second electrode layer 155.

Figure 2A:
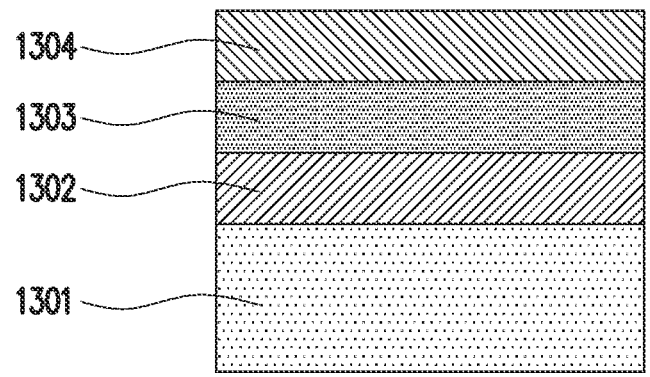
FIGS. 2A and 2B show schematic cross sectional views of magnetic layers of the MTJ film stack according to an embodiment of the present disclosure.

The second pinned magnetic layer 130 includes multiple layers of magnetic materials. In some embodiments, as shown in FIG. 2A, the second pinned magnetic layer 130 includes four layers 1301, 1302, 1303 and 1304, where the layer 1304 is in contact with the tunneling barrier layer 135 and the layer 1301 is in contact with the antiferromagnetic layer 125. In some embodiments, the layer 1301 (the bottommost layer) includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1301 is in a range from about 2.0 nm to about 5.0 nm in some embodiments. The layer 1302 includes a cobalt layer having a thickness in a range from about 0.4 nm to about 0.6 nm. In certain embodiments, the layer 1301 includes the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments. The layer 1304 includes a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

Figure 2B:
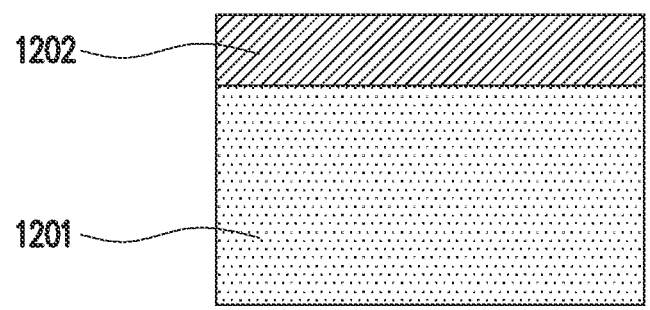

The first pinned magnetic layer 120 includes multiple layers of magnetic materials. In some embodiments, as shown in FIG. 2B, the first pinned magnetic layer 120 includes two layers 1201 and 1202, where the layer 1202 is in contact with the antiferromagnetic layer 125. In some embodiments, the layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm.

The free magnetic layer 140 includes a cobalt iron boron (CoFeB) layer, a cobalt/palladium (CoPd) layer and/or a cobalt iron (CoFe) layer having a thickness in a range from about 0.1 nm to about 2.0 nm in some embodiments. In other embodiments, the thickness of the free magnetic layer 140 is in a range from 0.2 nm to 1.5 nm. In certain embodiments, the thickness of the free magnetic layer 140 is in a range from 0.2 nm to 1.0 nm. The detailed structures of the free magnetic layer 140 will be described later.

The MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 includes a dielectric material, such as magnesium oxide, silicon oxide or aluminum oxide, and has a thickness in a range from about 0.5 nm to about 1.5 nm in some embodiments. The diffusion barrier layer 150 is made of the same as or different material than the capping layer 145, and includes a dielectric material, such as magnesium oxide, silicon oxide or aluminum oxide, and has a thickness in a range from about 0.5 nm to about 1.5 nm in some embodiments. When the diffusion barrier layer 150 is made of the same material as the capping layer, either one of the diffusion barrier layer 150 or the capping layer 145 is omitted.

The first electrode layer 110 includes a conductive material, such as a metal (e.g., Ta, Mo, Co, Pt, Ni), to reduce the resistance of the first pinned magnetic layer 120, especially for programming. The second electrode layer 155 also includes a conductive material, such as a metal, to reduce the resistivity during reading.

The pinned magnetic layer, the free magnetic layer and the antiferromagnetic layer can be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes, including low pressure CVD (LPCVD), ultrahigh vacuum CVD (UHVCVD), reduced pressure CVD (RPCVD), or any combinations thereof, or any other suitable film deposition method. The tunneling barrier layer and the diffusion barrier layer can also be formed by CVD, PVD or ALD or any other suitable film deposition method.

FIGS. 3A-3D show a memory operation of MTJ cells. As shown in FIGS. 3A-3D, the MTJ cell includes a pinned magnetic layer 10, a tunneling barrier layer 15 and a free magnetic layer 20. The pinned magnetic layer 10 corresponds to the second pinned magnetic layer 130 or the combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series. The cell size (the largest width of the MTJ stack) in plan view is in a range from about 10 nm to about 100 nm in some embodiments.

Figure 3A:
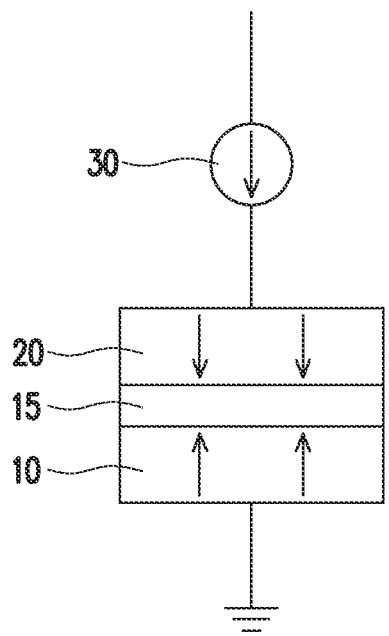
FIGS. 3A and 3B show operations of the MTJ film stack.
Figure 3B:
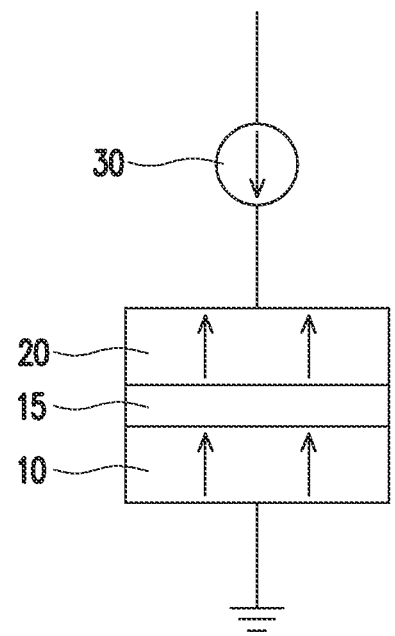
Figure 3C:
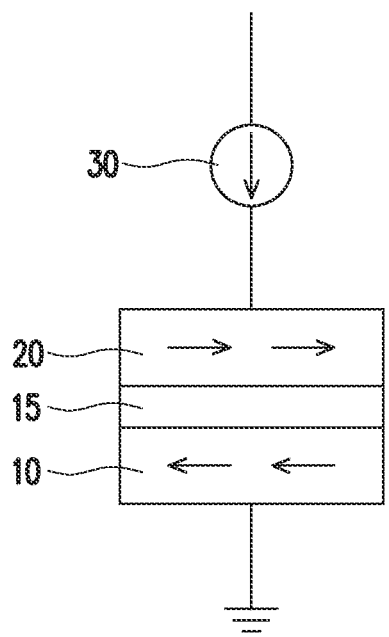
FIGS. 3C and 3D show operations of the MTJ film stack.
Figure 3D:
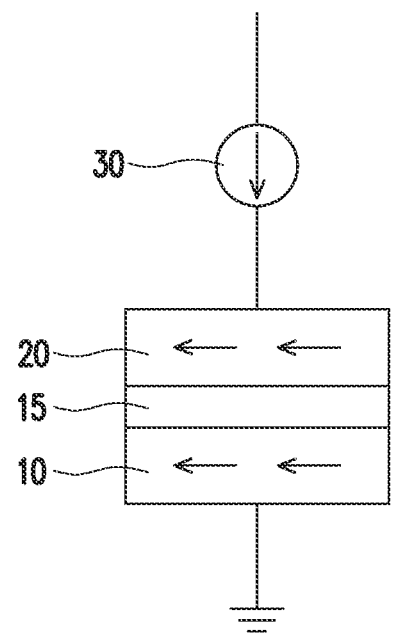

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in an MTJ cell and retrieved based on the cell orientation and resulting resistance. Further, since the stored data does not require a storage energy source, the cell is non-volatile.

Figure 4A:
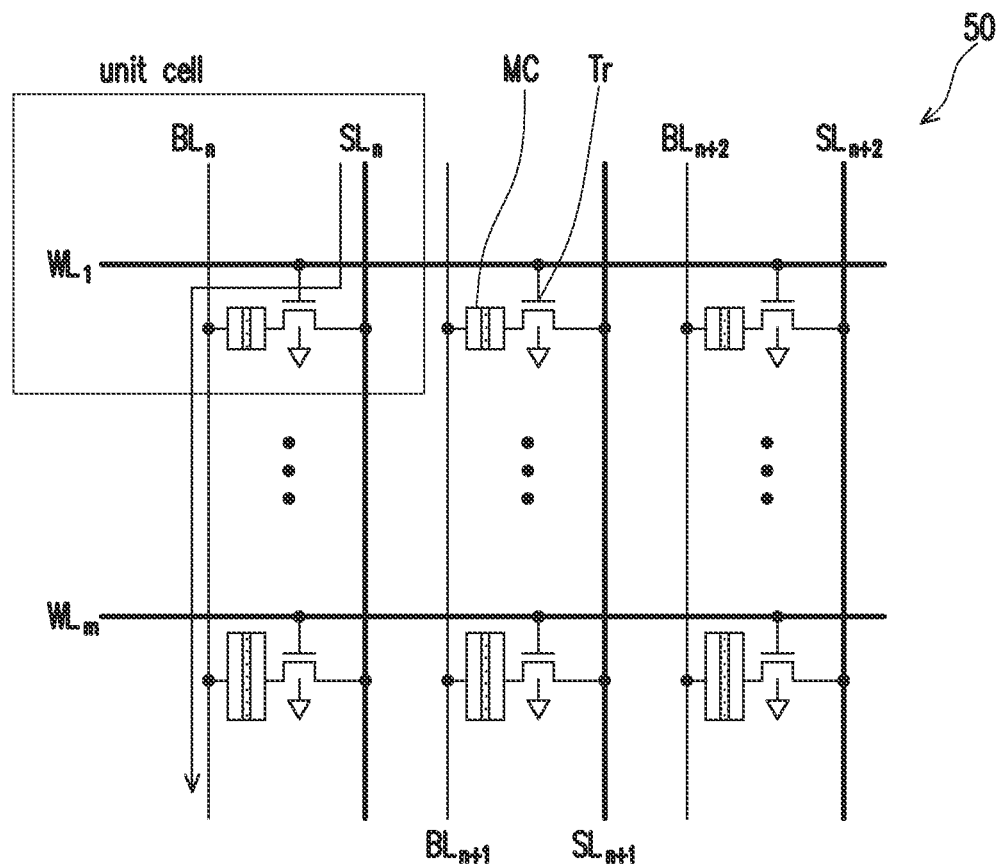
FIG. 4A shows a schematic circuit diagram of an MTJ MRAM.

FIG. 4A shows a schematic circuit diagram of an MTJ MRAM array 50. Each memory cell includes an MTJ cell Mc and a transistor Tr, such as a MOS FET. The gate of the transistor Tr is coupled to one of word lines $WL_1 \ldots WL_m$ and a drain (or a source) of the transistor Tr is coupled to one end of the MTJ cell Mc, and another end of the MTJ cell is coupled to one of bit lines $BL_n$, $BL_{n+1}$ and $BL_{n+2}$. Further, in some embodiments, signal lines (not shown) for programming are provided adjacent to the MTJ cells.

A memory cell is read by asserting the word line of that cell, forcing a reading current through the bit line of that cell, and then measuring the voltage on that bit line. For example, to read the state of a target MTJ cell, the word line is asserted to turn ON the transistor Tr. The free magnetic layer of the target MTJ cell is thereby coupled to one of the fixed potential lines $SL_n$, $SL_{n+1}$ and $SL_{n+2}$, e.g., the ground, through the transistor Tr. Next, the reading current is forced on the bit line. Since only the given reading transistor Tr is turned ON, the reading current flows through the target MTJ cell to the ground. The voltage of the bit line then measured to determine the state ("0" or "1") of the target MTJ cell. In some embodiments, as shown in FIG. 4A, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

Figure 4B:
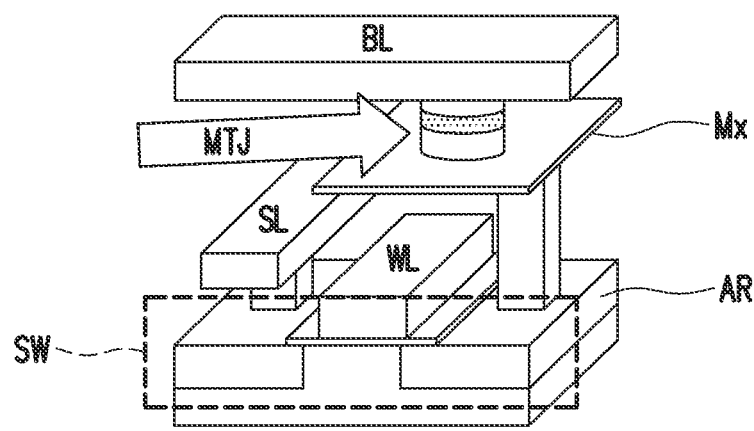
FIG. 4B shows a schematic perspective view of a memory cell of the MTJ MRAM and FIG. 4C shows a memory cell layout of the MTJ MRAM.
Figure 4C:
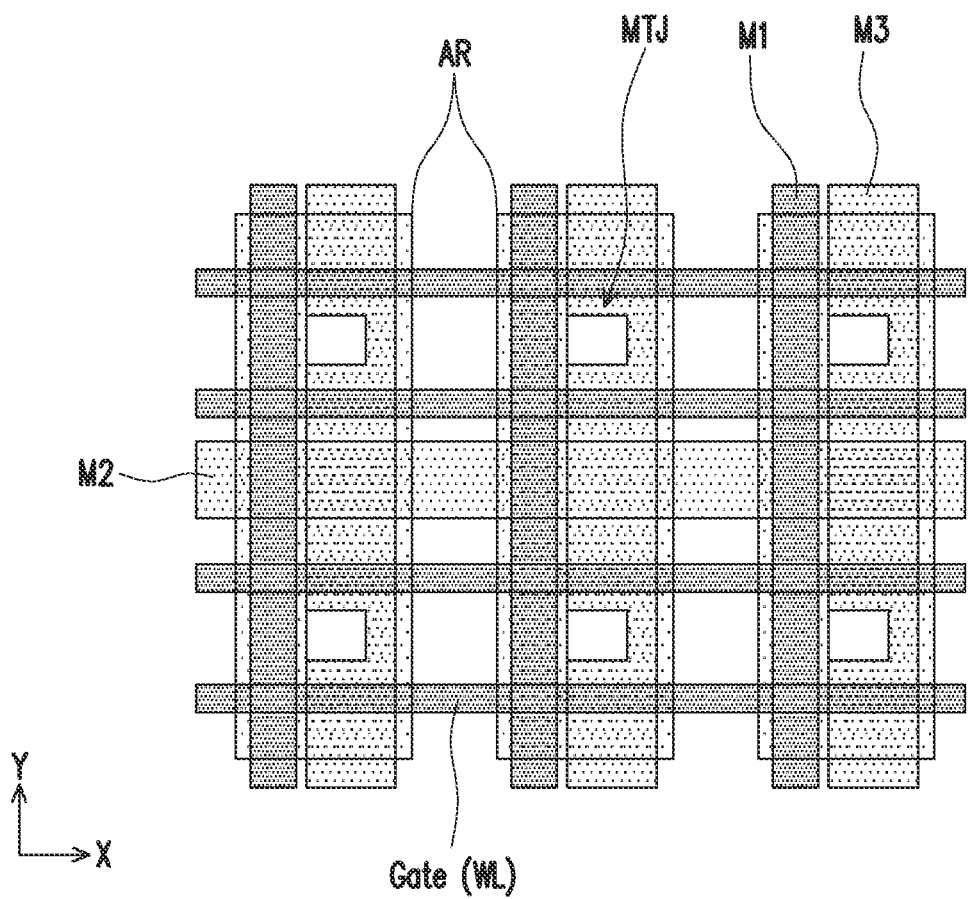

FIG. 4B shows a schematic perspective view of a memory cell of the MTJ MRAM and FIG. 4C shows a memory cell layout of the MTJ MRAM.

As shown in FIGS. 4B and 4C, the MTJ cell MTJ is disposed above a switching device SW, such as a MOS FET. The gate Gate of the MOSFET is a word line WL or coupled to a word line formed by a metal layer. The bottom electrode Mx of the MTJ cell is coupled to a drain of the MOS FET formed in an active region AR, and a source of the MOS FET formed in the active region AR is coupled to the source line SL. The upper electrode of the MTJ cell is coupled to a bit line BL. In some embodiments, the source line SL can be formed by metal layers M1 and M2, and the bit line BL can be formed by a metal layer M3. In certain embodiments, one of more metal wirings is a single device layer, and in other embodiments, one or more metal wirings are two or more device layers.

Figure 5A:
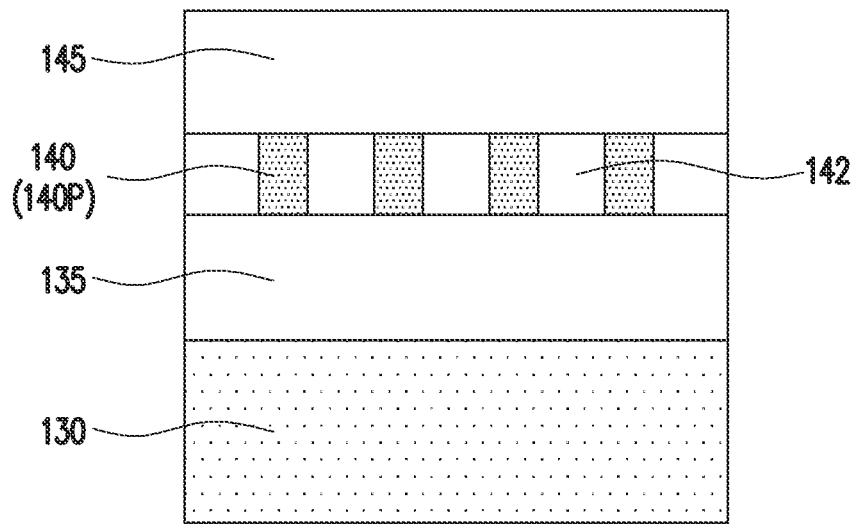
FIG. 5A shows a cross sectional view of a part of MTJ cell according to an embodiment of the present disclosure.

FIG. 5A shows a cross sectional view of a part of MTJ cell according to an embodiment of the present disclosure. Material, configuration, dimensions and/or processes the same as or similar to the foregoing embodiments described with FIGS. 1A-4C may be employed in the following embodiments, and detailed explanation thereof may be omitted.

FIG. 5A shows a pinned magnetic layer (second pinned magnetic layer) 130, a tunneling barrier layer 135, a free magnetic layer 140 and a capping layer 145. In the present disclosure, the free magnetic layer 140 includes a plurality of magnetic material pieces 140P separated from each other by a separation layer 142. In the present disclosure, the free magnetic layer 140 is not a single, integrated laminated layer. In some embodiments, the separation layer 142 is made of a non-magnetic material. In certain embodiments, the separation layer 142 is made of a dielectric material, such as magnesium oxide, silicon oxide or aluminum oxide.

In some embodiments, a non-magnetic material of the separation layer 142 is the same as the non-magnetic material of the tunneling barrier layer 135. In other embodiments, the non-magnetic material of the separation layer 142 is different from the non-magnetic material of the tunneling barrier layer 135. In some embodiments, the non-magnetic material of the separation layer 142 is the same as the non-magnetic material of the capping layer 145. In other embodiments, the non-magnetic material of the separation layer 142 is different from the non-magnetic material of the capping barrier layer 135. In certain embodiments, the non-magnetic material of the separation layer 142, the non-magnetic material of the tunneling barrier layer 135 and the non-magnetic material of the capping layer 145 are the same. Further, in some embodiments, as shown in FIG. 5A, the separation layer 142 is formed in direct contact with the tunneling barrier layer 135. The separation layer 142 is amorphous in some embodiments, and is single or poly crystalline in other embodiments.

Figure 5B:
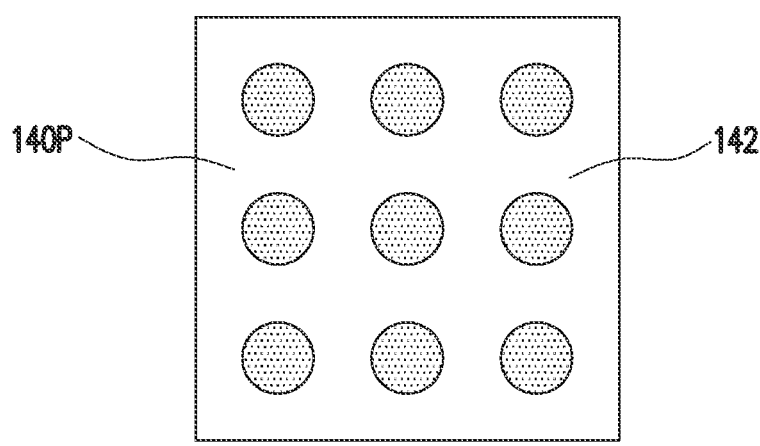
FIGS. 5B and 5C show plan views (top views) of a part of MTJ cell according to an embodiment of the present disclosure.
Figure 5C:
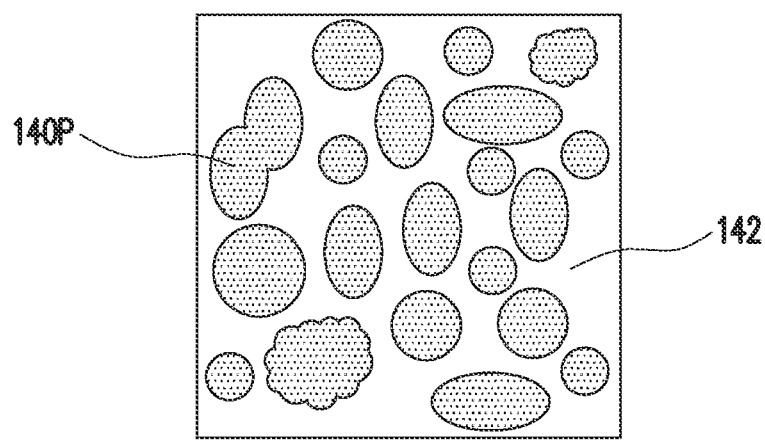

As shown in FIGS. 5B and 5C, the plurality of magnetic material pieces 140P are islands surrounded by the separation layer 142. In some embodiments, the shapes and/or sizes of the islands 140P are uniform. The size is a maximum width of the piece of magnetic material 140P, in some embodiments. In some embodiments, the variation (3σ) of the sizes is less than about 0.2 nm. The variation 3σ is calculated from, for example, measurements of 10 magnetic material pieces 140P.

In other embodiments, the shapes and/or sizes of the islands 140P are random. In some embodiments, the shapes are circular, oval, a cloud-shape and/or an undefined shape, as shown in FIG. 5C. The size of the islands 140P is the maximum width of the island in plan view.

In some embodiments, the average size of each of the plurality of magnetic material pieces 140P in plan view is in a range from about 0.5 nm to about 20 nm, and is in a range from about 1 nm to about 10 nm in other embodiments. In some embodiments, the variation (3σ) of the sizes is less than about 1 nm. The variation 3σ is calculated from, for example, measurements of 10 magnetic material pieces 140P.

In some embodiments, the average space between adjacent magnetic material pieces in plan view are in a range from about 0.2 nm to about 10 nm, and is in a range from about 1 nm to about 5 nm in other embodiments.

The thickness, which is the average height of the plurality of pieces (e.g., 10 pieces) of magnetic material, is in a range from about 0.2 nm to about 1.5 nm. In certain embodiments, the thickness of the free magnetic layer 140 is in a range from about 0.2 nm to about 1.0 nm. In some embodiments, the heights of the plurality of magnetic material pieces are random.

In some embodiments, the magnetic material pieces 140P have random magnetic directions. In certain embodiments, each of the magnetic material pieces 140P has one magnetic domain and/or is made of a single crystal.

In some embodiments, a ratio of areas of the plurality of magnetic material pieces 140P covering the first non-magnetic layer in plan view to an area of the tunneling barrier layer 135 within one MRAM cell is in a range from about 0.5 to about 0.9. In other words, about 50-90% of the surface of the tunneling barrier layer 135 within one MRAM cell is covered by the free magnetic layer 140P. In other embodiments, the ratio is in a range from about 0.6 to about 0.8.

FIGS. 6A-6E show cross sectional views of a part of MTJ cell according to other embodiments of the present disclosure.

Figure 6A:
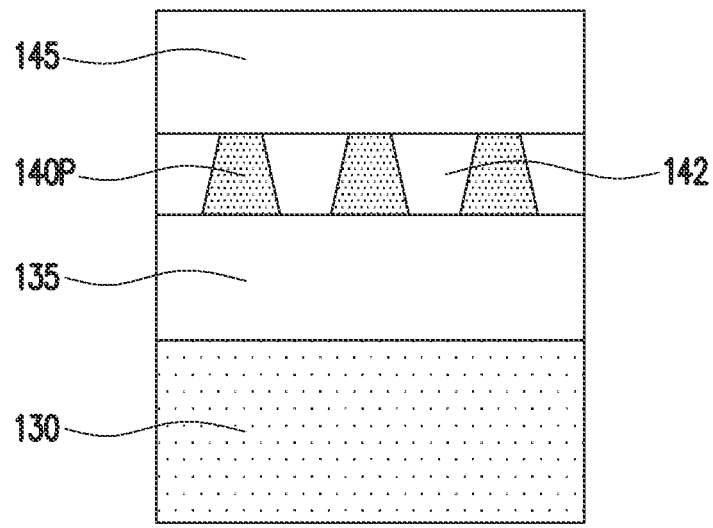
FIGS. 6A, 6B, 6C, 6D and 6E show cross sectional views of a part of MTJ cell according to other embodiments of the present disclosure.
Figure 6B:
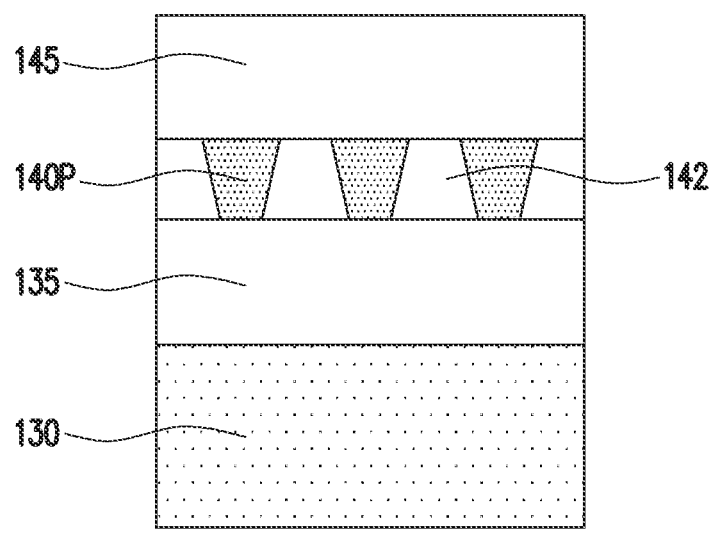
Figure 6C:
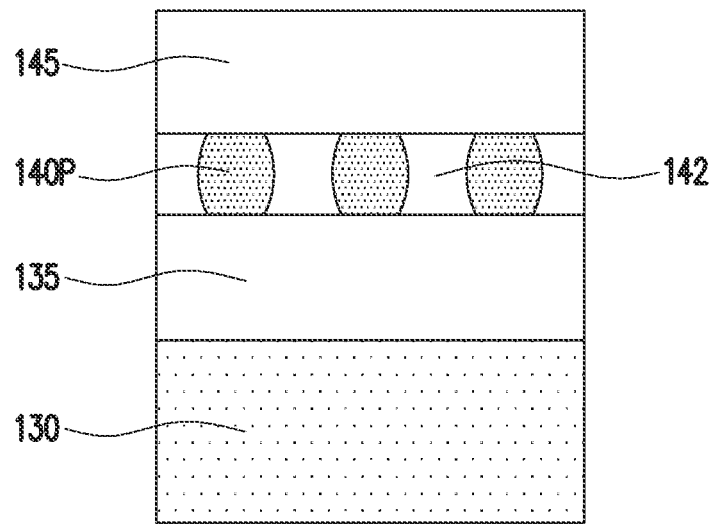
Figure 6D:
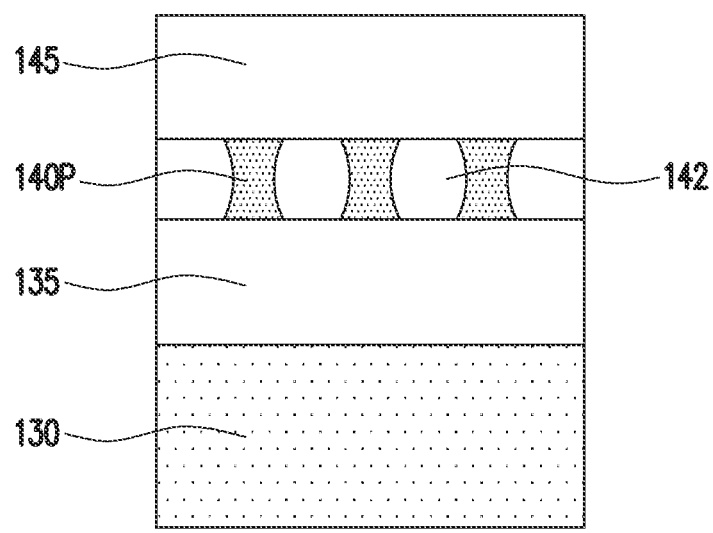
Figure 6E:
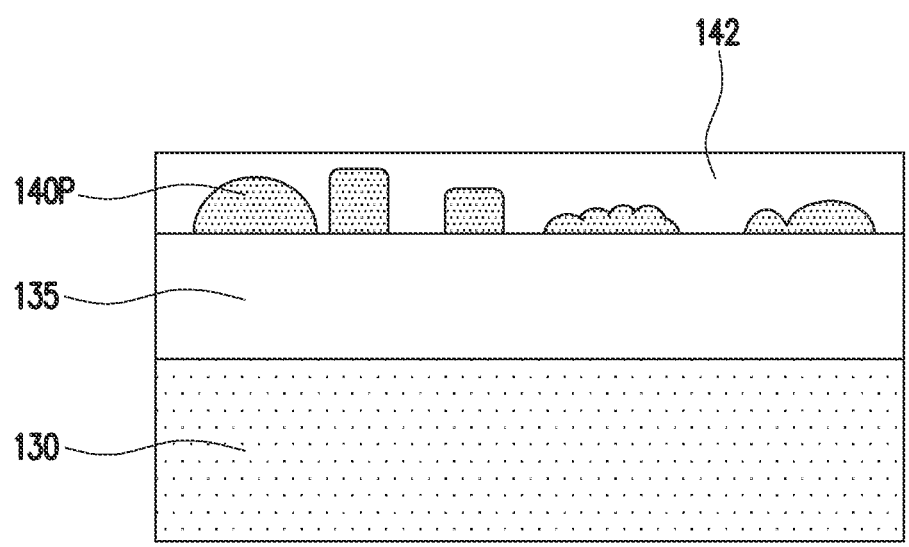

In some embodiments, the magnetic material pieces 140P have a tapered columnar shape having a width at the top smaller than a width at the bottom, as shown in FIG. 6A. In some embodiments, the magnetic material pieces 140P have a tapered columnar shape having a width at the top larger than a width at the bottom, as shown in FIG. 6B. In other embodiments, the magnetic material pieces 140P have a columnar barrel shape having the largest width at the middle, as shown in FIG. 6C. In other embodiments, the magnetic material pieces 140P have a columnar pincushion shape having the smallest width at the middle, as shown in FIG. 6D. In some embodiments, cross sectional shapes of the magnetic material pieces 140P are random, as shown in FIG. 6E.

FIGS. 7A-7E show various stages of a sequential manufacturing process of the semiconductor device including an MRAM call according to an embodiment of the present disclosure. It is understood that additional operations can be provided before, during, and after the processes shown by FIGS. 7A-7E, and some of the operations described below can be replaced or eliminated, for additional embodiments of the method. Material, configuration, dimensions and/or processes the same as or similar to the foregoing embodiments described with FIGS. 1A-6E may be employed in the following embodiments, and detailed explanation thereof may be omitted.

Figure 7A:
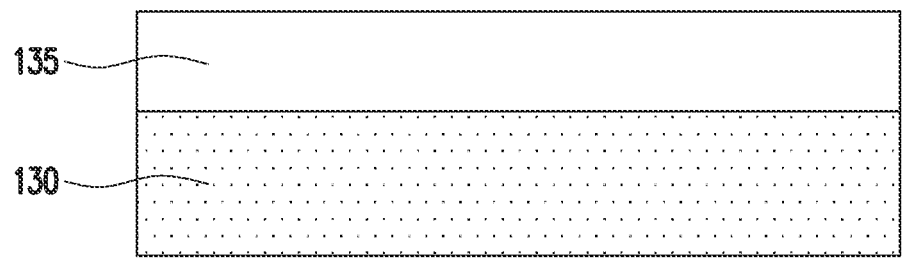
FIGS. 7A, 7B, 7C, 7D and 7E show various stages of a sequential manufacturing process of the semiconductor device including an MRAM call according to an embodiment of the present disclosure.

As shown in FIG. 7A, a first magnetic layer 130 is formed over a substrate (e.g., 201 shown in FIG. 9), and a first non-magnetic material layer 135 is formed over the first magnetic layer 130. The first magnetic layer 130 can be formed by PVD including a sputtering method, ALD and/or CVD or any other film formation methods. The first non-magnetic material layer 135 can be formed by CVD, PVD or ALD or any other suitable film deposition method.

Figure 7B:
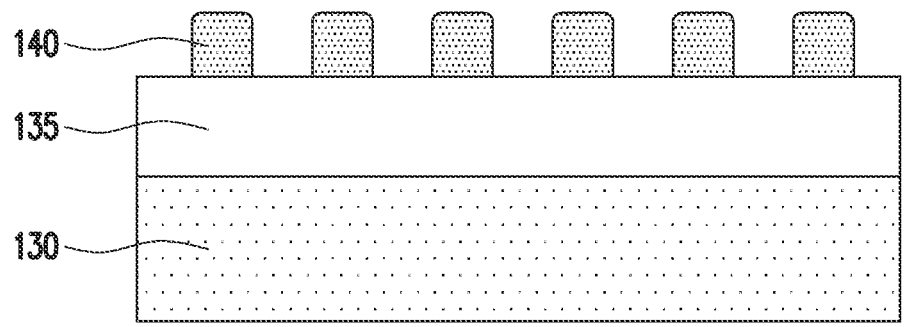

Next, as shown in FIG. 7B, a second magnetic layer 140 is formed over the first non-magnetic material layer 135. The second magnetic layer 140 can be formed by CVD, PVD or ALD or any other suitable film deposition method. In certain embodiments, a sputtering method is used. In some embodiments, a film deposition rate is in a range from about 0.01 nm/sec to about 0.5 nm/sec. When the thickness of the second magnetic layer 140 is less than a critical thickness, the second magnetic layer 140 can have a plurality of magnetic material pieces (islands), as shown in FIG. 7B.

Figure 7C:
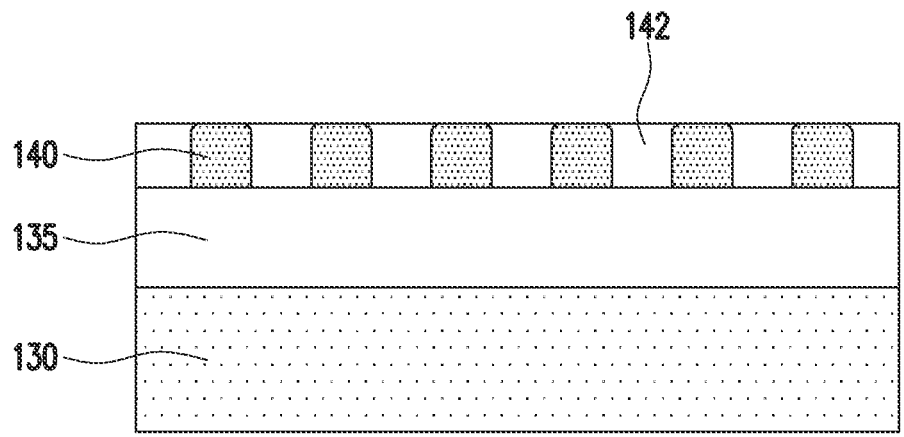

Subsequently, a second non-magnetic material layer 142 is formed over the second magnetic layer 140, as shown in FIG. 7C. Since the second magnetic layer 140 is formed of islands, the second non-magnetic material layer 142 fills the spaces between the magnetic material pieces (islands) and is formed in direct contact with exposed surface portions of the first non-magnetic material layer 135. In some embodiments, the second non-magnetic material layer 142 is formed at the level of the highest portion of the second magnetic layer 140 or lower. In other embodiments, the second non-magnetic material layer 142 is formed to a higher level than the highest portion of the second magnetic layer 140, and thus the plurality of pieces of magnetic materials are fully embedded in the second non-magnetic material layer 142. The second non-magnetic material layer 142 can be formed by CVD, PVD or ALD or any other suitable film deposition method.

Figure 7D:
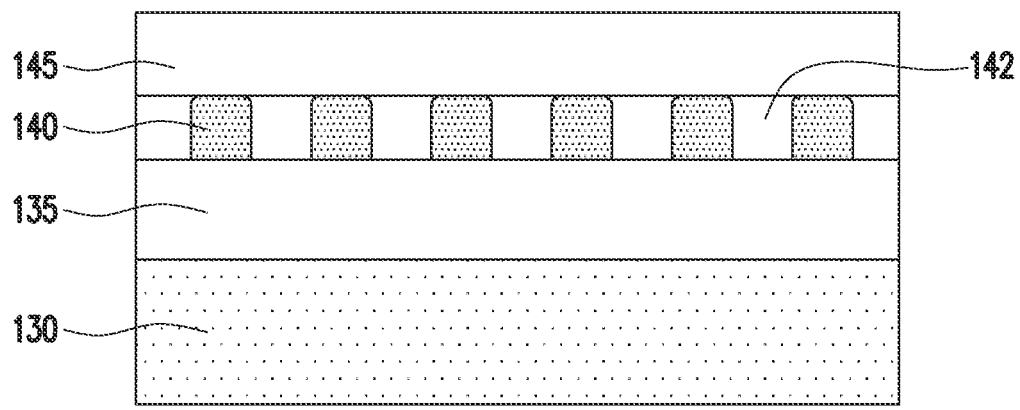

Further, as shown in FIG. 7D, a third non-magnetic material layer 145, as the capping layer, is formed over the second non-magnetic material layer 142 and the second magnetic layer 140. The third non-magnetic material layer 145 can be formed by CVD, PVD or ALD or any other suitable film deposition method.

Figure 7E:
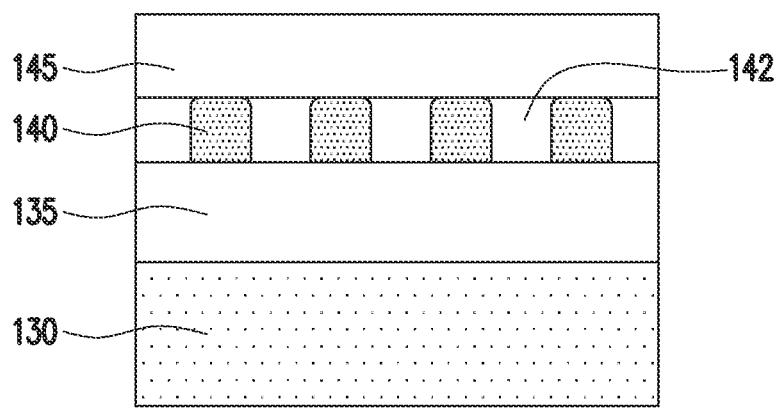

Subsequently, the third non-magnetic material layer 145, the second non-magnetic material layer 142, the second magnetic layer 140, the first non-magnetic material layer 135 and the first magnetic layer 130 are patterned by using one or more lithography and etching operations, as shown in FIG. 7E. In some embodiments, before the patterning, one or more additional layers are formed over the third non-magnetic material layer 145.

Figure 8A:
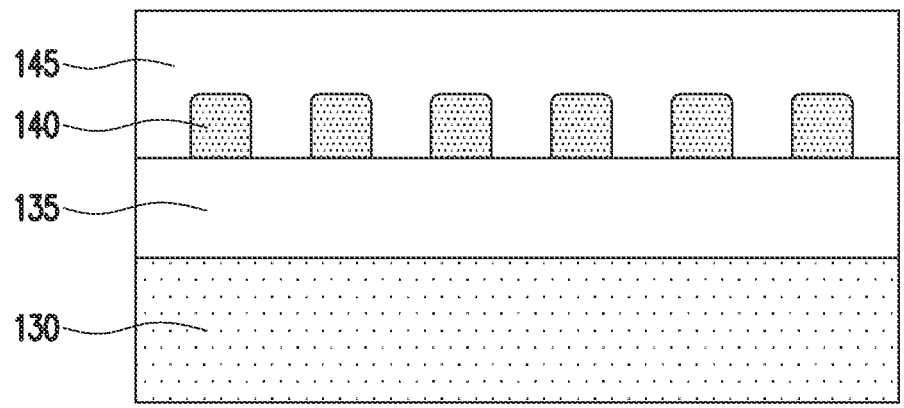
FIGS. 8A and 8B show various stages of a sequential manufacturing process of the semiconductor device including an MRAM cell according to other embodiments of the present disclosure.
Figure 8B:
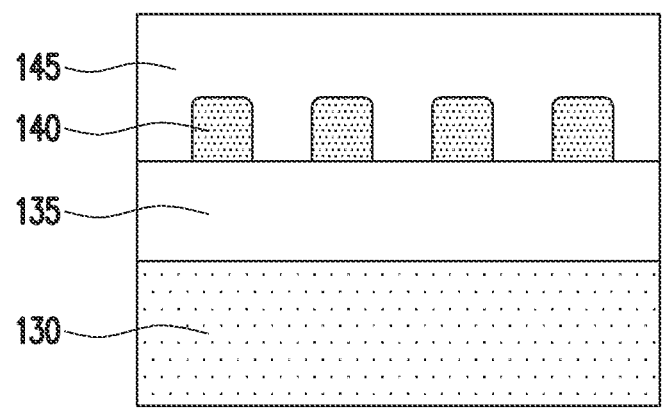

FIGS. 8A and 8B show various stages of a sequential manufacturing process of the semiconductor device including an MRAM cell according to other embodiments of the present disclosure.

In some embodiments, after the second magnetic layer 140 is formed, a third (or the second) non-magnetic layer 145 is formed is a single film formation operation, so that the plurality of pieces of magnetic materials are fully embedded in the third (second) non-magnetic material layer 145. Then, as shown in FIG. 8B, the third (second) non-magnetic material layer 145, the second magnetic layer 140, the first non-magnetic material layer 135 and the first magnetic layer 130 are patterned by using one or more lithography and etching operations.

Figure 8C:
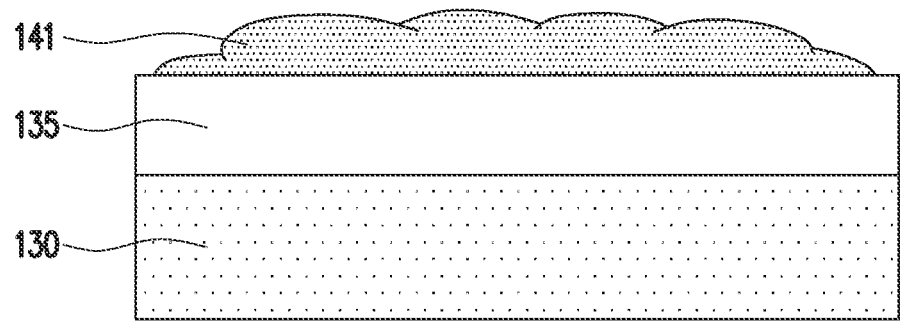
FIGS. 8C and 8D show various stages of a sequential manufacturing process of the semiconductor device including an MRAM cell according to other embodiments of the present disclosure.
Figure 8D:
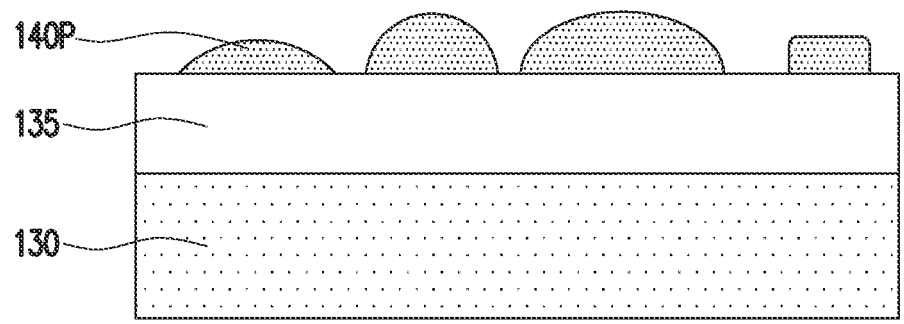

FIGS. 8C and 8D show various stages of a sequential manufacturing process of the semiconductor device including an MRAM cell according to other embodiments of the present disclosure.

In some embodiments, after the second magnetic layer 140 is formed, an annealing operation is performed. When the second magnetic layer 140 is formed as a non-segregated layer 141 as shown in FIG. 8C, by the annealing operation, the non-segregated layer becomes a plurality of magnetic material pieces 140P, as shown in FIG. 8D.

In some embodiments, the annealing temperature is in a range from about 400° C. to about 800° C. In certain embodiments, the annealing temperature is in a range from about 400° C. to about 600° C. for about 5 min to about 90 min. In other embodiments, the annealing temperature is in a range from about 600° C. to about 800° ° C. for about 5 sec to about 30 min. The annealing operation can be lamp annealing using an infrared lamp or laser annealing.

In some embodiments, the thickness of the second magnetic layer 140 can be measured by wavelength dispersive X-ray fluorescence (WDXRF).

Figure 9:
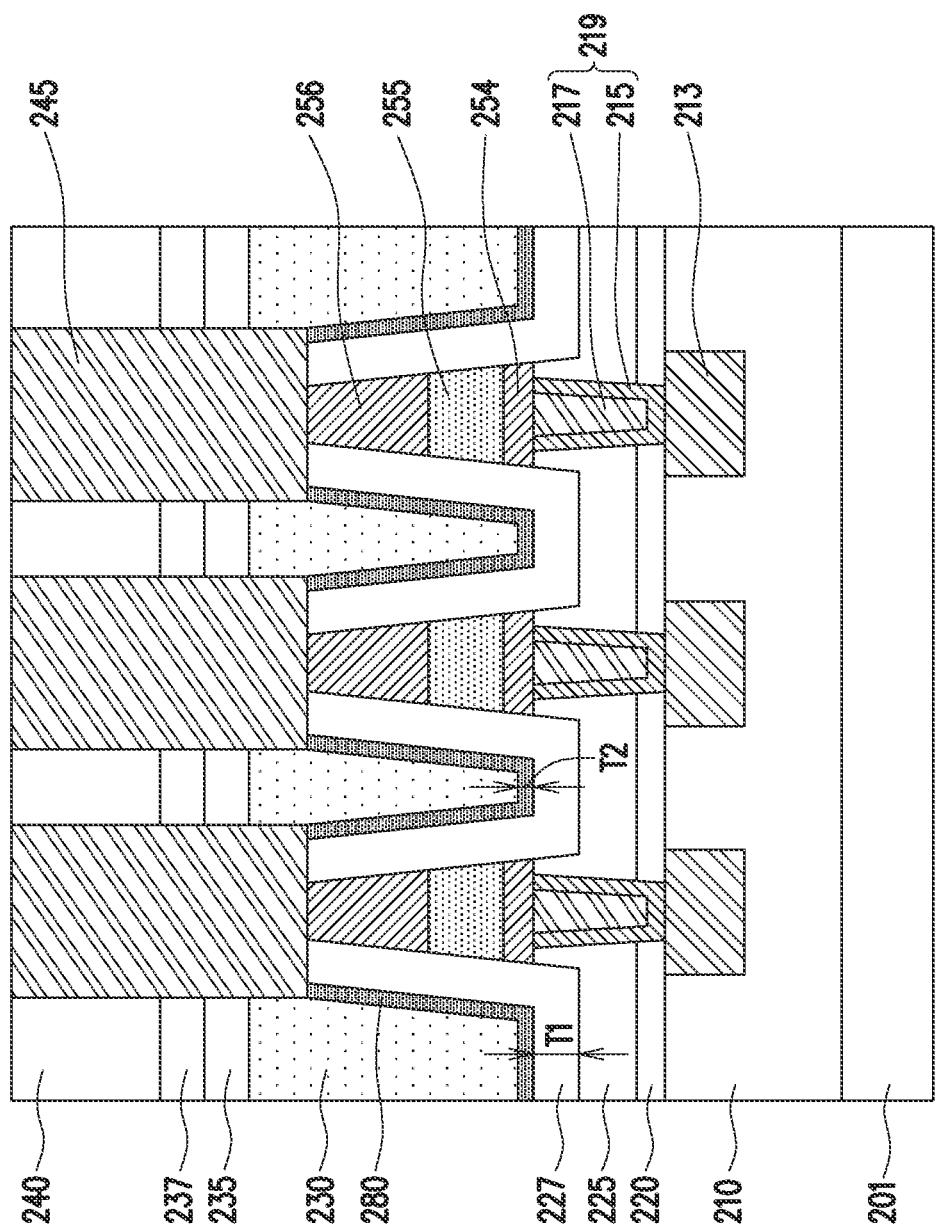
FIG. 9 shows a cross sectional view of the semiconductor device including MRAM cells according to an embodiment of the present disclosure.

FIG. 9 shows a cross sectional view of an MTJ MRAM according to an embodiment of the present disclosure. Material, configuration, dimensions and/or processes the same as or similar to the foregoing embodiments described by FIGS. 1A-4D may be employed in the following embodiments, and detailed explanation thereof may be omitted.

As shown in FIG. 9, the MTJ cells of an MRAM are disposed over a substrate 201. The cell size (the largest width of the MTJ stack) in plan view is in a range from about 10 nm to about 100 nm in some embodiments.

The MTJ cells of an MRAM are disposed over a substrate 201. In some embodiments, the substrate 201 includes a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 210 is disposed over the substrate 201 to cover the electronic devices. The first ILD layer 210 may be referred to as an inter-metal dielectric (IMD) layer. The first ILD layer 210 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 210 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 213 is formed by, for example, a damascene process. The lower metal wiring 213 includes one or more layers of conductive material, such as Cu, a Cu alloy, Al or any other suitable conductive materials. Each of the MTJ cells is disposed over the lower metal wiring 215, as shown in FIG. 9. Although FIG. 9 shows three MTJ cells, the number of the MTJ cells is not limited to three.

As shown in FIG. 9, a first insulating layer 220 as an etch stop layer is formed on the first ILD layer 210. In some embodiments, the first insulating layer 220 includes a material different from the first ILD layer 210 and includes silicon carbide, silicon nitride, aluminum oxide or any other suitable material. The thickness of the first insulating layer 220 is in a range from about 10 nm to about 25 nm in some embodiments.

A second ILD layer 225 is formed over the first insulating layer 220. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210 and the material for the second ILD layer 225 are the same. In other embodiments, different dielectric materials are used for the first ILD layer 210 and the second ILD layer 225.

A via contact 219 is formed in contact with the lower metal wiring 215 and passing through the second ILD layer 225 and the first etch stop layer 220 in some embodiments. In some embodiments, the via contact 219 includes a liner layer 215 and a body layer 217. The liner layer 215 includes one or more layers of Ti, TiN, Ta or TaN, or other suitable material, and the body layer 217 includes one or more layers of W, Cu, Al, Mo, Co, Pt, Ni, and/or an alloy thereof or other suitable material, in some embodiments.

An MRAM cell includes a bottom electrode 254, an MTJ film stack 255 and a top electrode 256, as shown in FIG. 9. The bottom electrode 254, the MTJ film stack 255 and the top electrode 256 correspond to the first electrode 110, the MTJ functional layer 101 and the second electrode 155 of FIG. 1B. The MRAM cell structure has a tapered shape as shown in FIG. 9. The width of the MRAM cell structure at the bottom (the bottom electrode 254) is greater than the width at the top (the top electrode 256). The thickness of the bottom electrode 254 is in a range from about 5 nm to about 20 nm in some embodiments. The thickness of the MTJ film stack 255 is in a range from about 15 nm to about 50 nm in some embodiments.

In some embodiments, a first insulating cover layer 227 as a sidewall spacer layer is formed on opposing side walls of the MRAM cell structure. The first insulating cover layer 227 includes one or more layers of insulating material. In some embodiments, a nitride-based insulating material is used. In certain embodiments, the nitride-based insulating material is a silicon nitride-based insulating material, such as silicon nitride, SiON, SiCN and SiOCN. The thickness T1 of the first insulating cover layer 227 is in a range from about 5 nm to about 30 nm in some embodiments, and is in a range from about 10 nm to about 20 nm in other embodiments.

Further, a second insulating cover layer 280 is formed over the first insulating cover layer 227. The second insulating cover layer 280 includes one or more layers of an insulating material different from the first insulating cover layer 227. In some embodiments, an aluminum-based insulating material is used. In certain embodiments, the aluminum-based insulating material includes aluminum oxide, aluminum nitride, aluminum oxynitride, aluminum carbide and/or aluminum oxycarbide. The thickness T2 of the second insulating cover layer 280 is smaller than the thickness T1 of the first insulating cover layer in some embodiments. The thickness T2 is in a range from about 1 nm to about 10 nm in some embodiments, and is in a range from about 3 nm to about 5 nm in other embodiments.

Further a third ILD layer 230 is disposed in spaces between the MRAM cell structures. The third ILD layer 230 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210, the material for the second ILD layer 225 and the material for the third ILD layer 230 are the same. In other embodiments, at least two of them are made of different dielectric materials.

Further, a fourth ILD layer is disposed over the third ILD layer 230. In some embodiments, the fourth ILD layer is a multiple layer structure and includes a first dielectric layer 235 as an etch stop layer formed on the third ILD layer 230, a second dielectric layer 237 formed on the first dielectric layer 235 and a third dielectric layer 240 formed on the second dielectric layer. In other embodiments, the fourth ILD layer is a two-layer structure without one of the first or second dielectric layers.

In some embodiments, the first dielectric layer 235 and second dielectric layer 237 are made of a different material than the third dielectric layer 240 and include one or more layers of silicon nitride, SiON, SiOCN, SiCN, SiC or any other suitable material. In some embodiments, the first dielectric layer 235 and second dielectric layer 237 are made of different materials from each other.

The third dielectric layer 240 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the material for the first ILD layer 210, the material for the second ILD layer 225, the material for the third ILD layer 230 and the material for the third dielectric layer 240 are the same. In other embodiments, at least two of them are made of different dielectric materials. The thickness of the third dielectric layer 240 is greater than the thicknesses of the first and second dielectric layers 235 and 237 in some embodiments.

A conductive contact 245 is formed in contact with the top electrode 256, as shown in FIG. 9. The conductive contact 245 is the same as or similar to the lower metal wiring 213 and/or the via contact 219 and is made of, for example, Cu, Al, Ta, Ti, Mo, Co, Pt, Ni, W, TiN and/or TaN and/or an alloy thereof or other suitable material.

As shown in FIG. 9, the upper surface of the top electrode 256 is substantially flush with the upper surfaces of the first insulating cover layer 227 and/or the second insulating cover layer 280 in some embodiments.

FIGS. 10A-15B show various stages of a sequential manufacturing process of a semiconductor device including an MRAM according to an embodiment of the present disclosure. It is understood that additional operations can be provided before, during, and after processes shown by FIGS. 10A-15F, and some of the operations described below can be replaced or eliminated, for additional embodiments of the method. Material, configuration, dimensions and/or processes the same as or similar to the foregoing embodiments described with FIGS. 1A-9 may be employed in the following embodiments, and detailed explanation thereof may be omitted.

Figure 10A:
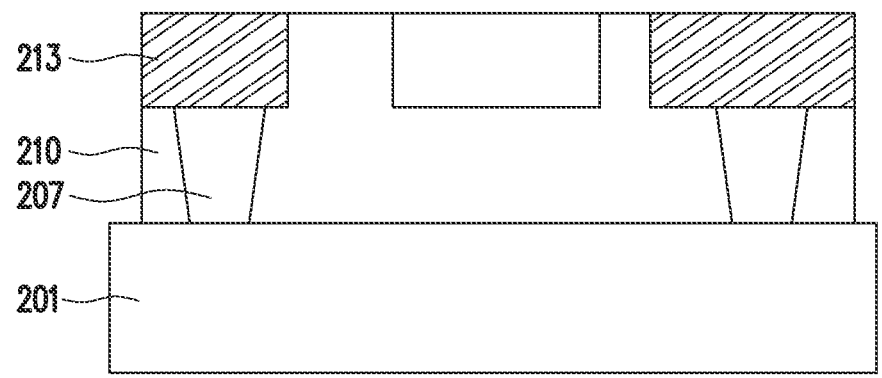
FIGS. 10A, 10B and 10C show various stages of a sequential manufacturing process of the semiconductor device including an MRAM according to an embodiment of the present disclosure.
Figure 10B:
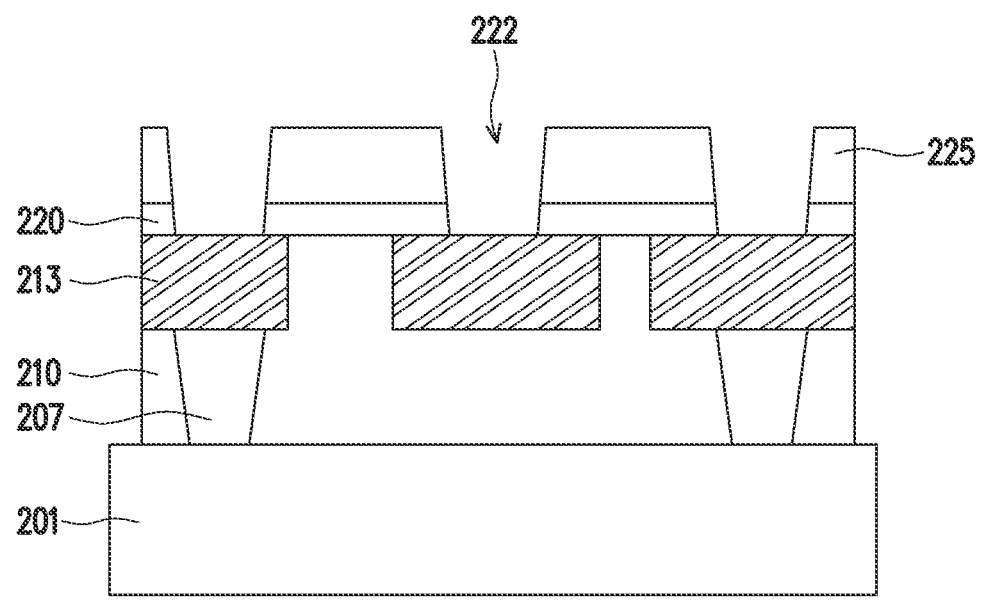
Figure 10C:
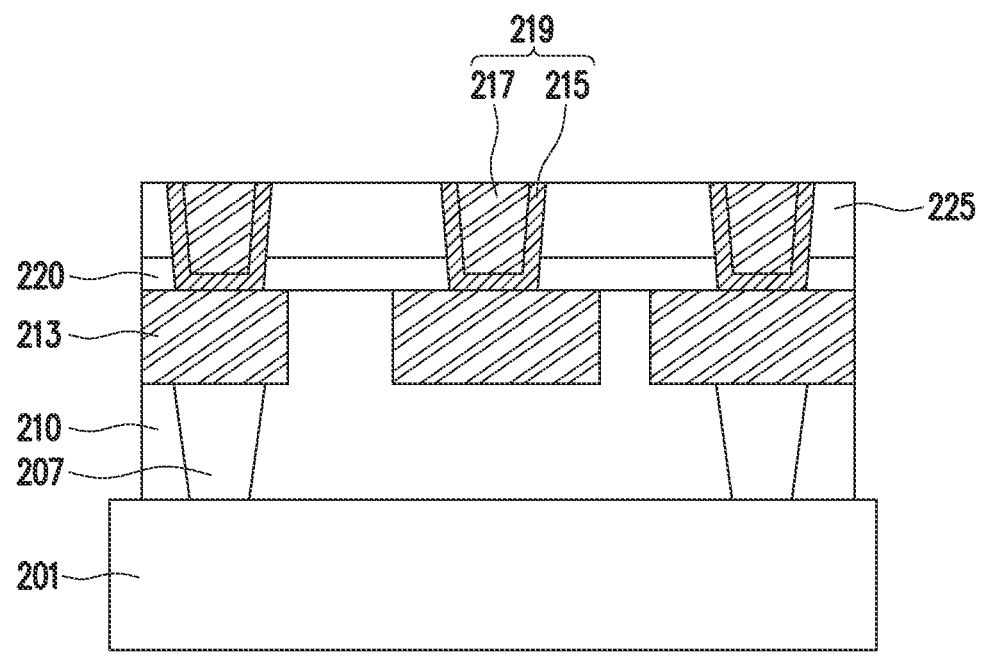

As shown in FIG. 10A, lower metal wirings 213 are formed in the first ILD layer 210 over the substrate 201. In some embodiments, via contacts 207 are provided under the lower metal wirings 213. Then, as shown in FIG. 10B, a first insulating layer as an etch stop layer 220 is formed over the structure of FIG. 10A, and a second ILD layer 225 is formed over the first insulating layer 220. Further, as shown in FIG. 10B, via contact openings 222 are formed to expose the upper surface of the lower metal wirings 213, by using one or more lithography and etching operations. Subsequently, a via contact 219 including layers 215 and 217 are formed, as shown in FIG. 10C. One or more film forming operations, such as CVD, PVD including sputtering, ALD, electro-chemical plating and/or electro-plating, are performed, and a planarization operation, such as CMP, is performed to fabricate the via contacts 219.

Then, as shown in FIG. 11A, a first conductive layer 254A for the bottom electrode 254, a stacked layer 255A for the MTJ film stack 255 and a second conductive layer 256A for the top electrode 256 are sequentially formed. In some embodiments, a hard mask layer 300 formed on the second conductive layer 256A. The stacked layer 255A includes at least a first magnetic layer 130, a first non-magnetic material layer 135, a second magnetic layer 140 and a second and/or third non-magnetic material layer 142, 145.

Figure 11B:
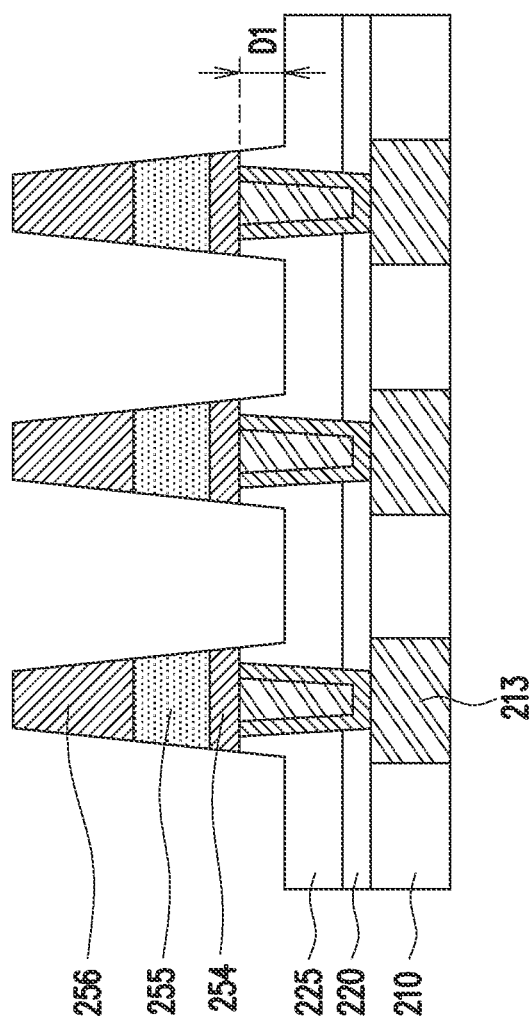

By using one or more lithography and etching operations, the film stack shown in FIG. 11A is patterned into an MRAM cell structure including the bottom electrode 254, the MTJ film stack 255 and the top electrode 256, as shown in FIG. 11B. In some embodiments, after patterning the second conductive layer 256A, the stacked layer 255A and the first conductive layer 256A, the second ILD layer 225 is partially recessed. The amount DI of the recess is in a range from about 1 nm to about 30 nm in some embodiments.

Figure 12A:
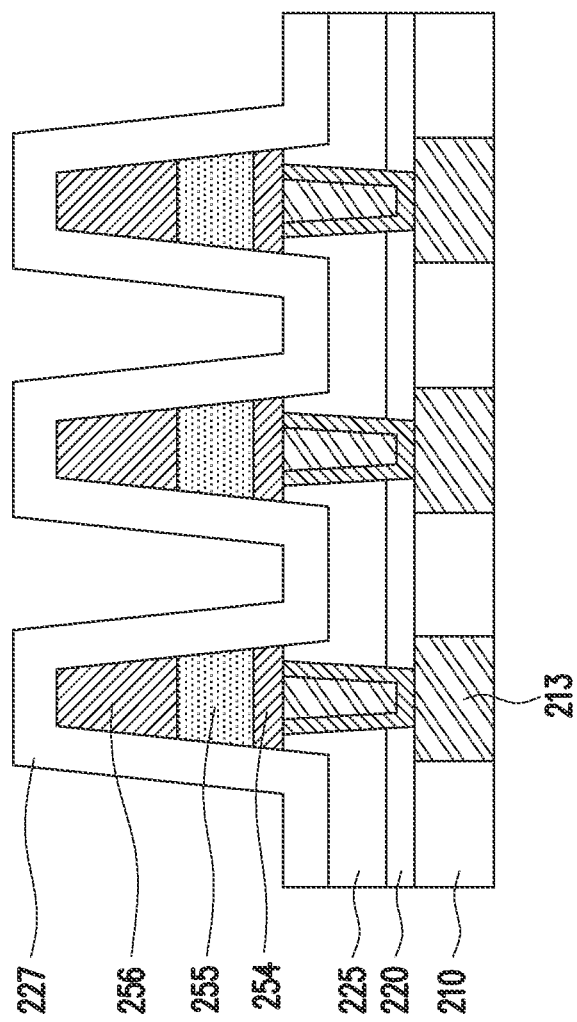

Subsequently, as shown in FIG. 12A, a first insulating cover layer 227 is formed to cover the MRAM cell structure. The first insulating cover layer 227 can be formed by CVD, PVD or ALD or any other suitable film deposition method. In some embodiments, the first insulating cover layer 227 is formed by CVD, PVD or ALD at a temperature range less than about 150° C., such as a range from about 100° C. to about 150° C. When the first insulating cover layer 227 is formed at a higher temperature, such as a range from about 200° C. to about 300° C. (or more), the film formation process may cause damage to the MTJ film stack 255 since the first insulating cover layer 227 is directly formed on the MTJ film stack 255. As shown in FIG. 12A, the first insulating cover layer 227 is conformally formed.

Then, as shown in FIG. 12B, a second insulating cover layer 280 is formed to cover the MRAM cell structure. The second insulating cover layer 280 can be formed by CVD, PVD or ALD or any other suitable film deposition method. As shown in FIG. 12B, the second insulating cover layer 280 is conformally formed. As set forth above, the second insulating cover layer 280 includes an aluminum-based insulating material in some embodiments. The aluminum-based insulating material, such as AlO ($Al_2O_3$), AlN, AlC, AlOC and AlON, can be formed by the following operations. First, an aluminum layer is formed on the first insulating cover 227. The aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlN, AlC, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC, AlC, AlN and/or AlON layer can be directly formed by CVD, PVD or ALD or other suitable method by using appropriate source gases. In some embodiments, the second insulating cover layer 280 is formed by CVD, PVD or ALD at a temperature range in a range from about 300° C. to about 450° C. Although a lower forming temperature (e.g., less than 300° C.) may be employed, since the first insulating cover layer 227 covers the MTJ film stack 255, a higher forming temperature (about 300° C. to about 450° C.) may not damage the MTJ film stack 255. In some embodiments, dielectric material other than aluminum-based insulating material (e.g., silicon nitride, SiC, SiON or SiCN) is used as the second insulating cover layer 280. In some embodiments, the second insulating cover layer 280 is not used.

Figure 13A:
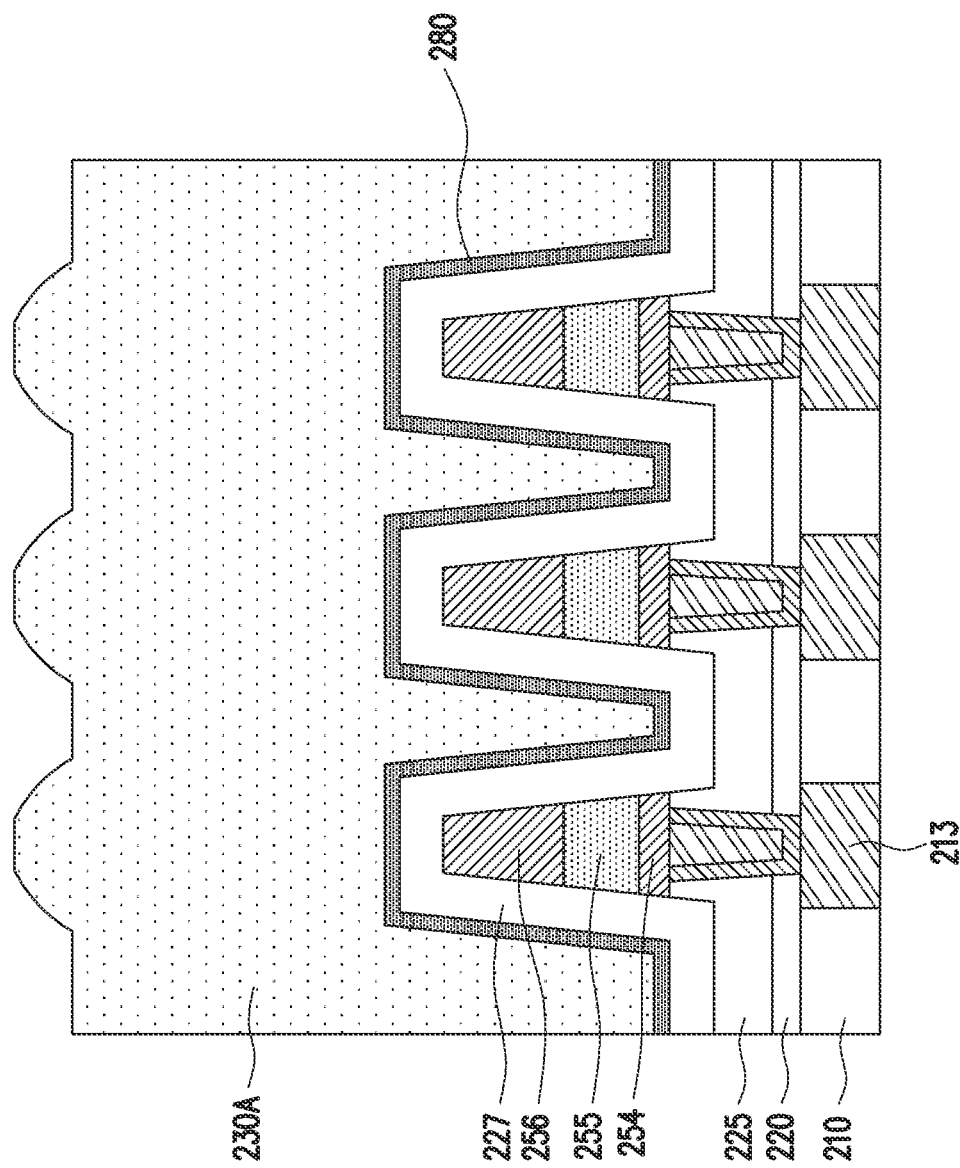
FIGS. 13A and 13B show various stages of a sequential manufacturing process of the semiconductor device including an MRAM according to another embodiment of the present disclosure.
Figure 13B:
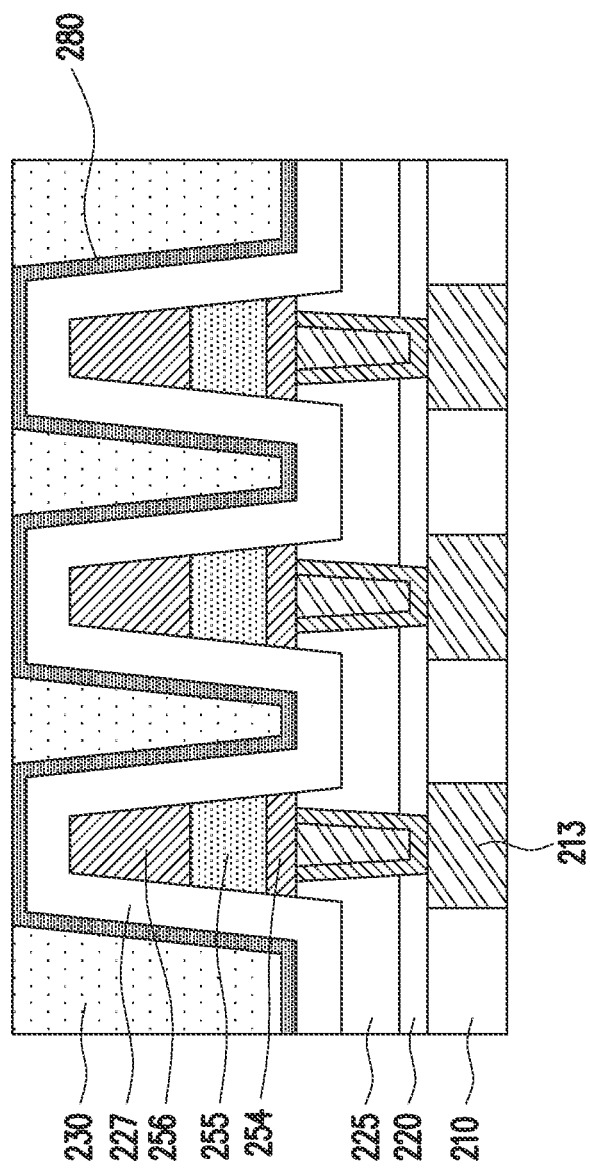

Next, as shown in FIG. 13A, a dielectric material layer 230A for the third ILD layer 230 is formed to fully cover the second insulating cover layer 280. In some embodiments, an etch-back operation is performed on the dielectric material layer 230A, and then a CMP operation is performed, as shown in FIG. 13B. Because the selectivity for the CMP operation between the second insulating cover layer 280 and the third ILD layer 230 is high, the CMP operation can utilize the second insulating cover layer 280 as a stop layer. When the CMP operation stops at the upper surface of the second insulating cover layer 280, it is possible to prevent over-etching of the third ILD layer 230, and thus the upper surface of the second insulating cover layer 280 above the MRAM cell structure is substantially flush with the upper surfaces of the third ILD layer 230 in some embodiments.

Figure 14A:
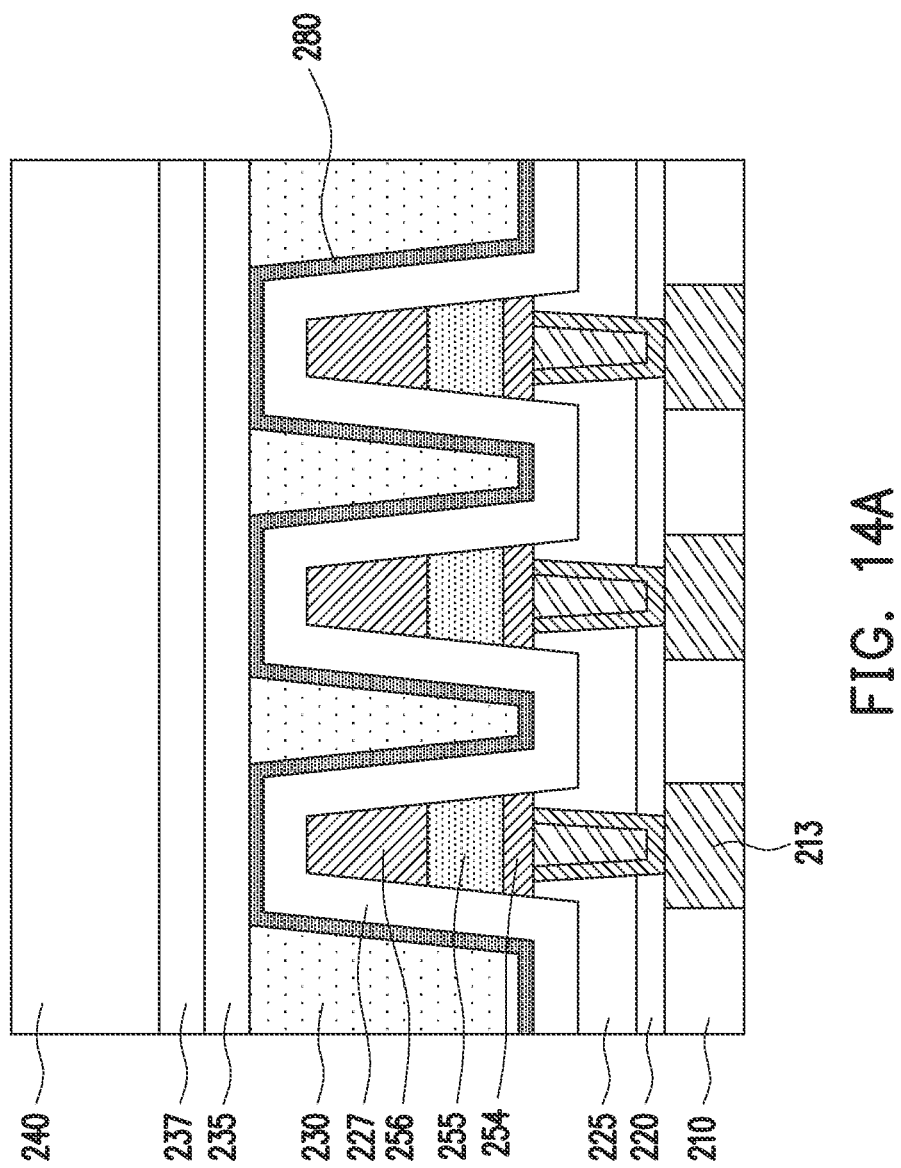
FIGS. 14A and 14B show various stages of a sequential manufacturing process of the semiconductor device including an MRAM according to another embodiment of the present disclosure.

Subsequently, as shown in FIG. 14A, a fourth ILD layer including a first dielectric layer 235, a second dielectric layer 237 and a third dielectric layer 240 is formed over the structure of FIG. 14B. The dielectric layers of the fourth ILD layer can be formed by CVD, PVD or ALD or other suitable film formation method. In some embodiments, the third dielectric layer 240 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Figure 14B:
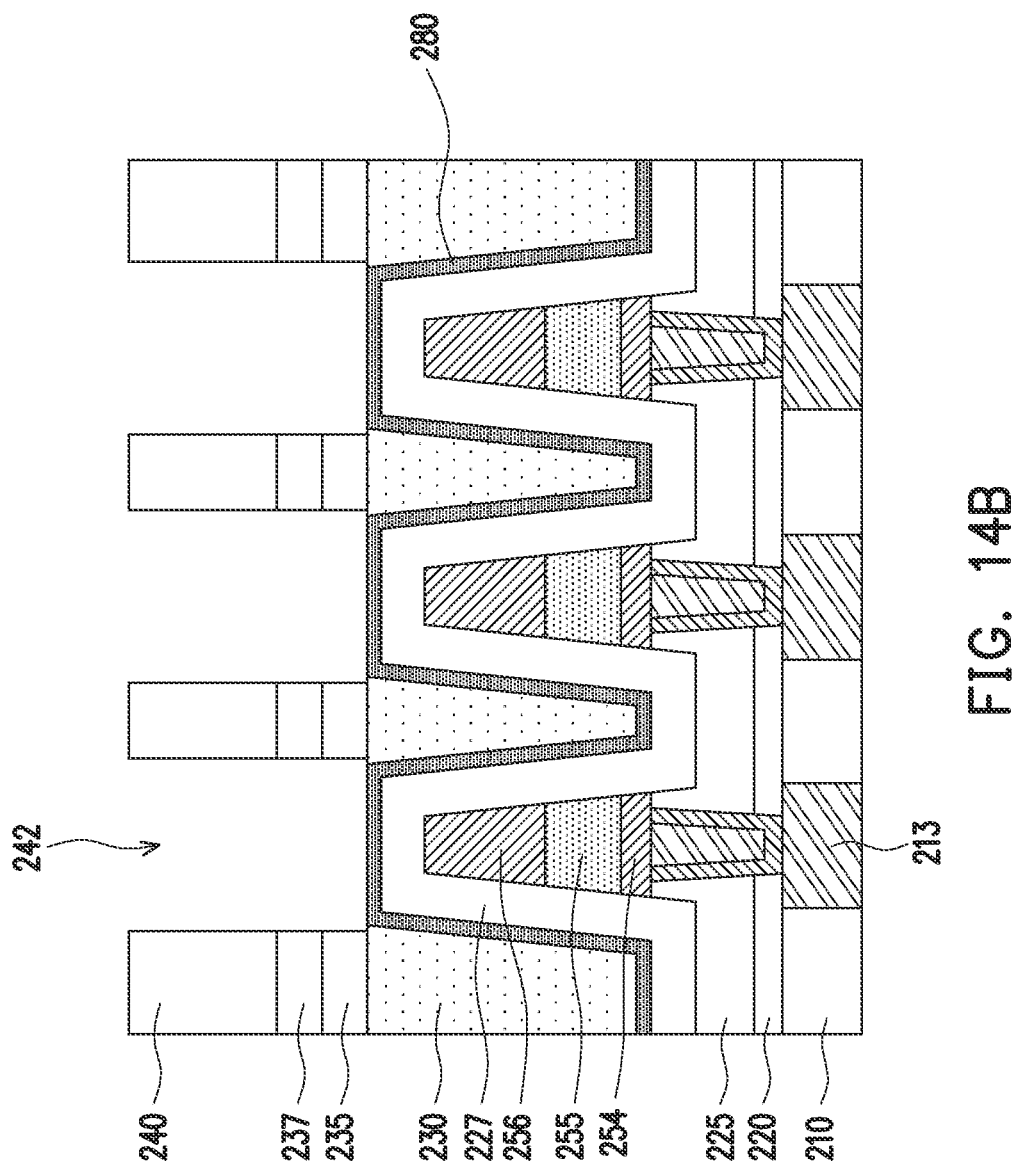

Then, as shown in FIG. 14B, contact openings 242 are formed by using one or more lithography and etching operations. Because the selectivity in the etching operation between the second insulating cover layer 280 and the fourth ILD layer is high, the etching operation can utilize the second insulating cover layer 280 as an etch stop layer.

Figure 15A:
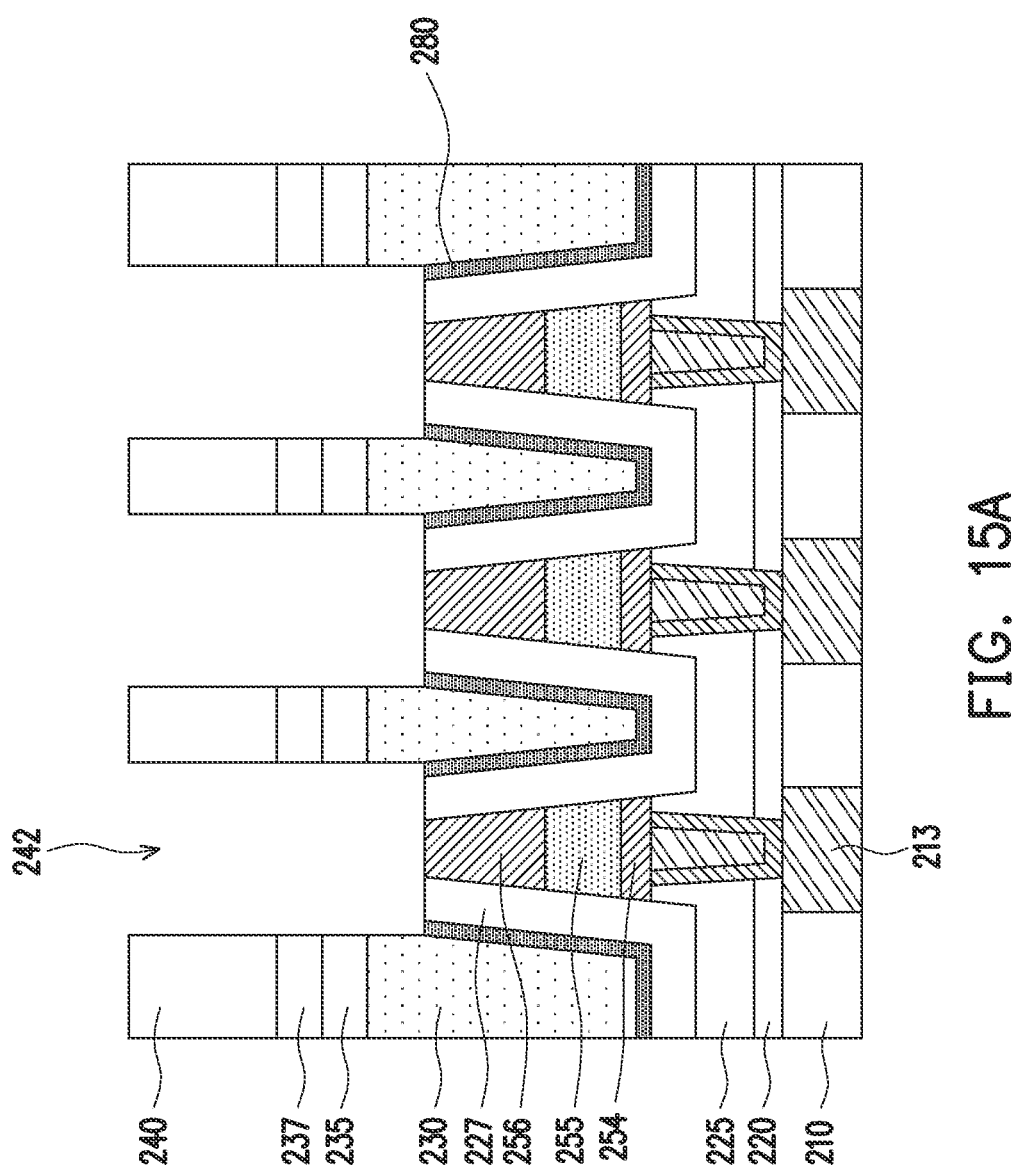
FIGS. 15A and 15B show various stages of a sequential manufacturing process of the semiconductor device including an MRAM according to another embodiment of the present disclosure.
Figure 15B:
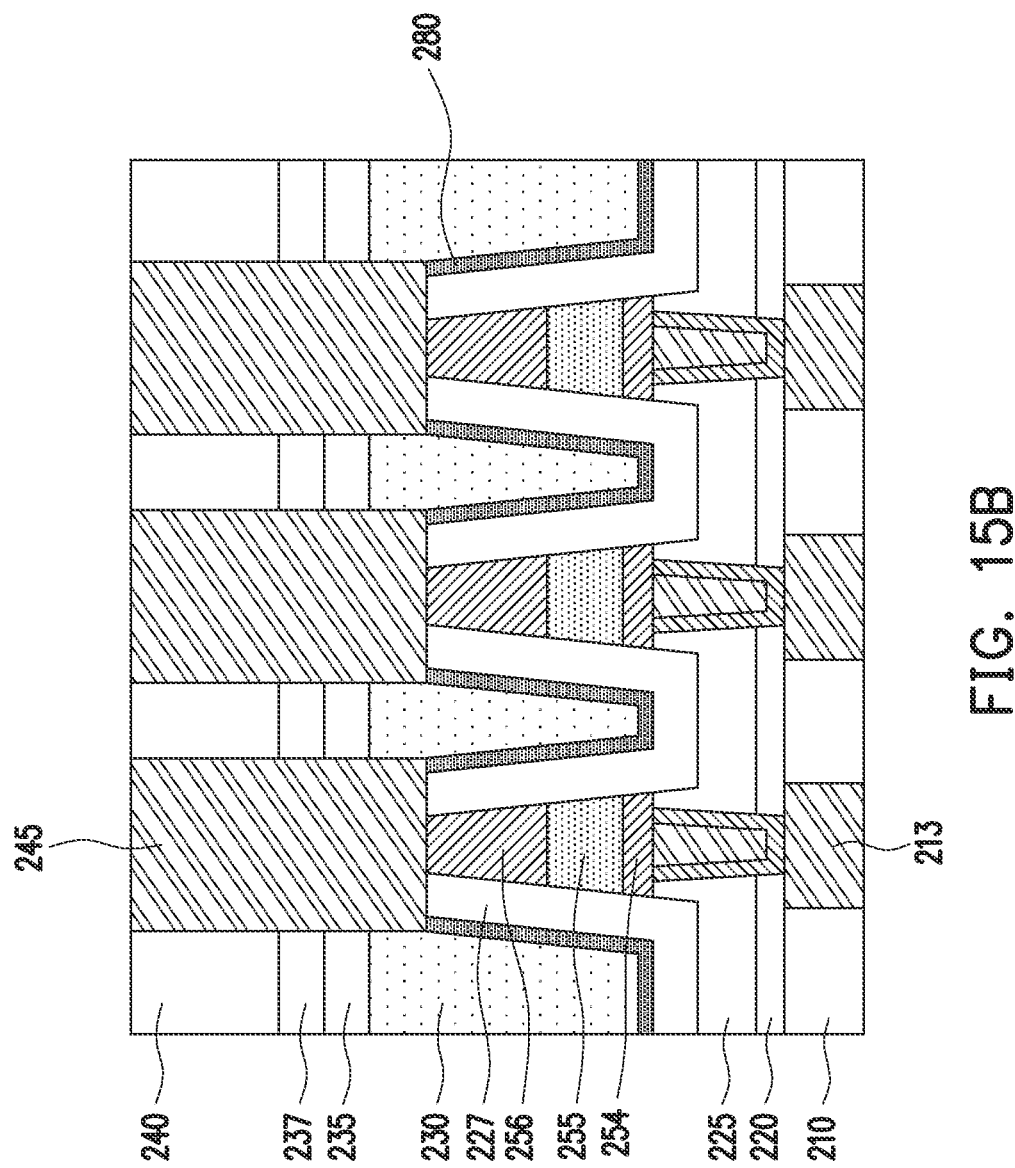

Next, as shown in FIGS. 15A and 15B, a part of the second insulating cover layer 280 and a part of the first insulating cover layer 227 are removed by dry and/or wet etching, thereby exposing the top electrode 256. In some embodiments, part of the second insulating cover layer 280 is removed, and then part of the first insulating cover layer 227 is removed. In some embodiments, one or more wet etching operations is used. In certain embodiments, a wet etching operation is performed to remove the second insulating cover layer 280 and a dry etching operation is performed to remove first insulating cover layer 227. In other embodiments, a wet etching operation is also performed to remove the first insulating cover layer 227. By using wet etching, it is possible to suppress damage to the MTJ film stack 255.

Subsequently, as shown in FIG. 15B, the contact openings 242 are filled with a conductive material so as to form conductive contacts 245 contacting the exposed top electrode 256.

It is understood that the device shown in FIG. 11B undergoes further semiconductor processes to form various features such as interconnect metal layers, dielectric layers, passivation layers, etc.

It will be understood that not all advantages have been necessarily discussed herein, no particular advantage is required for all embodiments or examples, and other embodiments or examples may offer different advantages.

In the present embodiments, a plurality of magnetic material pieces are used as a free magnetic layer (a segregated layer). This structure can change the nature of the free magnetic layer design from a default single domain to default multiple domains. If the size of the domains, or grains, is much smaller than the device CD (e.g., a cell size) and the magnetic material pieces are tightly distributed, device CD scale-down will have no obvious impact on the property distribution. For example, when the current density to switch the free magnetic layer (Jc) and the resistivity of the free magnetic layer (Ra) are the same, the write current, voltage and power can be decreased (scaled-down) with the total cross section of the magnetic grains. For that reason, the segregated free magnetic layer structure can have a smaller write current, voltage and power.

In accordance with an aspect of the present disclosure, in a method of manufacturing a magnetic random access memory (MRAM) cell, a first magnetic layer is formed over a substrate. A first non-magnetic material layer is formed over the first magnetic layer. A second magnetic layer is formed over the first non-magnetic material layer. A second non-magnetic material layer is formed over the second magnetic layer. The second non-magnetic material layer, the second magnetic layer, the first non-magnetic material layer and the first magnetic layer are patterned, thereby forming the MRAM cell. The second magnetic layer in the MRAM cell includes a plurality of magnetic material pieces separated from each other. In one or more of the foregoing and following embodiments, the plurality of magnetic material pieces are separated from each other by a non-magnetic material. In one or more of the foregoing and following embodiments, a third non-magnetic material layer is further formed over the second magnetic layer before forming the second non-magnetic material layer, thereby separating the plurality of pieces of magnetic material. In one or more of the foregoing and following embodiments, the non-magnetic material of the second non-magnetic material layer is same as the non-magnetic material separating the plurality of pieces of magnetic material. In one or more of the foregoing and following embodiments, the non-magnetic material of the second non-magnetic material layer is different from the non-magnetic material separating the plurality of pieces of magnetic material. In one or more of the foregoing and following embodiments, the non-magnetic material separating the plurality of magnetic material pieces is a dielectric material. In one or more of the foregoing and following embodiments, the third non-magnetic material layer is formed in direct contact with the first non-magnetic material layer. In one or more of the foregoing and following embodiments, sizes of the plurality of magnetic material pieces in plan view are random. In one or more of the foregoing and following embodiments, heights of the plurality of magnetic material pieces are random. In one or more of the foregoing and following embodiments, a thickness of the second magnetic layer is in a range from 0.2 nm to 1.5 nm. In one or more of the foregoing and following embodiments, a size of each of the plurality of magnetic material pieces in plan view is in a range from 1 nm to 10 nm. In one or more of the foregoing and following embodiments, spaces between adjacent pieces of magnetic material in plan view are in a range from 0.2 nm to 5 nm. In one or more of the foregoing and following embodiments, each of the plurality of magnetic material pieces has one magnetic domain.

In accordance with another aspect of the present disclosure, in a method of manufacturing an MRAM cell, a first magnetic layer is formed over a substrate, a first non-magnetic material layer is formed over the first magnetic layer, a second magnetic layer is formed over the first non-magnetic material layer and a second non-magnetic material layer is formed over the second magnetic layer and in direct contact with the first non-magnetic material layer. The second non-magnetic material layer, the second magnetic layer, the first non-magnetic material layer and the first magnetic layer are patterned, thereby forming the MRAM cell. The second magnetic layer in the MRAM cell includes a plurality of islands of magnetic material separated from each other. In one or more of the foregoing and following embodiments, the plurality of islands of magnetic material are separated from each other by the second non-magnetic material layer. In one or more of the foregoing and following embodiments, a thickness of the second non-magnetic material layer is greater than a largest height of the plurality of islands of magnetic material. In one or more of the foregoing and following embodiments, the second non-magnetic material layer is made of MgO. In one or more of the foregoing and following embodiments, each of the plurality of islands of magnetic material has one magnetic domain.

In accordance with another aspect of the present disclosure, in a method of manufacturing an MRAM cell, a first magnetic layer is formed over a substrate, a first non-magnetic material layer is formed over the first magnetic layer, a second magnetic layer is formed over the first non-magnetic material layer, an annealing operation is performed on the second magnetic layer, and a second non-magnetic material layer is formed over the second magnetic layer. The second non-magnetic material layer, the second magnetic layer, the first non-magnetic material layer and the first magnetic layer are patterned, thereby forming the MRAM cell. The second magnetic layer in the MRAM cell includes a plurality of magnetic material pieces separated from each other. In one or more of the foregoing and following embodiments, an annealing temperature of the annealing operation is in a range from 400° C. to 800° ° C.

In accordance with one aspect of the present disclosure, a semiconductor device includes a magnetic random access memory (MRAM) cell. The MRAM cell includes: a first magnetic layer disposed over a substrate, a first non-magnetic material layer made of a non-magnetic material and disposed over the first magnetic layer, a second magnetic layer disposed over the first non-magnetic material layer, and a second non-magnetic material layer disposed over the second magnetic layer. The second magnetic layer includes a plurality of magnetic material pieces separated from each other. In one or more of the foregoing and following embodiments, the plurality of magnetic material pieces are separated from each other by a non-magnetic material. In one or more of the foregoing and following embodiments, a non-magnetic material of the second non-magnetic material layer is same as the non-magnetic material separating the plurality of pieces of magnetic material. In one or more of the foregoing and following embodiments, a non-magnetic material of the second non-magnetic material layer is different from the non-magnetic material separating the plurality of pieces of magnetic material. In one or more of the foregoing and following embodiments, a non-magnetic material of the first non-magnetic material layer is same as the non-magnetic material separating the plurality of pieces of magnetic material. In one or more of the foregoing and following embodiments, a non-magnetic material of the first non-magnetic material layer is different from the non-magnetic material separating the plurality of pieces of magnetic material. In one or more of the foregoing and following embodiments, the first non-magnetic material layer, the second non-magnetic material layer and the non-magnetic material separating the plurality of magnetic material pieces are made of a same material. In one or more of the foregoing and following embodiments, the non-magnetic material separating the plurality of magnetic material pieces is a dielectric material. In one or more of the foregoing and following embodiments, the dielectric material is magnesium oxide. In one or more of the foregoing and following embodiments, sizes of the plurality of magnetic material pieces in plan view are random. In one or more of the foregoing and following embodiments, heights of the plurality of magnetic material pieces are random. In one or more of the foregoing and following embodiments, a thickness of the second magnetic layer is in a range from 0.2 nm to 1.5 nm. In one or more of the foregoing and following embodiments, a size of each of the plurality of magnetic material pieces in plan view is in a range from 1 nm to 10 nm. In one or more of the foregoing and following embodiments, spaces between adjacent of pieces of magnetic material in plan view are in a range from 0.2 nm to 5 nm. In one or more of the foregoing and following embodiments, the plurality of magnetic material pieces has random magnetic directions. In one or more of the foregoing and following embodiments, a ratio of areas of the plurality of magnetic material pieces covering the first non-magnetic layer to an area of the first non-magnetic layer is in a range from 0.5 to 0.9. In one or more of the foregoing and following embodiments, each of the plurality of magnetic material pieces has one magnetic domain. In one or more of the foregoing and following embodiments, a width of each of the plurality of magnetic material pieces is non-uniform along a vertical direction.

In accordance with another aspect of the present disclosure, a semiconductor device includes an MRAM cell. The MRAM cell includes an MRAM cell structure disposed over a substrate. The MRAM cell structure includes a bottom electrode, a magnetic tunnel junction (MTJ) stack and a top electrode. The MRAM cell structure includes a first insulating cover layer covering sidewalls of the MRAM cell structure, a second insulating cover layer disposed over the first insulating cover layer, a dielectric layer, and a conductive contact in contact with the top electrode. The first insulating cover layer is made of a nitride-based insulating material. The second insulating cover layer is made of an aluminum-based insulating material different from the nitride-based insulating material. The MTJ stack includes: a pinned magnetic layer disposed over a substrate, a tunneling barrier layer disposed over the first magnetic layer, a free magnetic layer disposed over the tunneling barrier layer, and a capping layer disposed over the second magnetic layer. The second magnetic layer includes a plurality of islands of magnetic material separated from each other.

In accordance with another aspect of the present disclosure, an MRAM includes a matrix of MRAM cells. The MRAM cell includes: a first magnetic layer disposed over a substrate, a first non-magnetic material layer made of a non-magnetic material and disposed over the first magnetic layer, a second magnetic layer disposed over the first non-magnetic material layer, and a second non-magnetic material layer disposed over the second magnetic layer. The second magnetic layer includes a plurality of magnetic material pieces separated from each other by and embedded in the second non-magnetic material layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM), comprising:
    a first magnetic layer disposed over a substrate;
    a first non-magnetic layer disposed over the first magnetic layer;
    a second magnetic layer disposed over the first non-magnetic layer;
    a second non-magnetic layer disposed over the second magnetic layer; and
    a third non-magnetic layer disposed over the second non-magnetic layer, wherein:
    the second magnetic layer includes a plurality of magnetic material pieces,
    the plurality of magnetic material pieces are in direct contact with the first non-magnetic layer, and
    when viewed from above, shapes of the plurality of magnetic material pieces includes a circular shape, an oval shape or a cloud-shape.

2. The MRAM of claim 1, wherein the second non-magnetic layer is disposed between adjacent ones of the plurality of magnetic material pieces.

3. The MRAM of claim 2, wherein the second non-magnetic layer is made of magnesium oxide.

4. The MRAM of claim 2, wherein a material of the second non-magnetic layer is same as a material of the third non-magnetic layer.

5. The MRAM of claim 2, wherein a material of the second non-magnetic layer is different from a material of the third non-magnetic layer.

6. The MRAM of claim 2, wherein the third non-magnetic layer includes at least one of magnesium oxide, silicon oxide or aluminum oxide.

7. The MRAM of claim 1, wherein the second non-magnetic layer is formed in direct contact with the first non-magnetic material layer.

8. The MRAM of claim 1, wherein a size of each of the plurality of magnetic material pieces in plan view is in a range from 0.5 nm to 20 nm.

9. The MRAM of claim 1, wherein heights of the plurality of magnetic material pieces are random.

10. The MRAM of claim 1, wherein a thickness of the second magnetic layer is in a range from 0.2 nm to 1.5 nm.

11. The MRAM of claim 1, wherein a size of each of the plurality of magnetic material pieces in plan view is in a range from 1 nm to 10 nm.

12. The MRAM of claim 1, wherein spaces between adjacent pieces of magnetic material in plan view are in a range from 0.2 nm to 5 nm.

13. The MRAM of claim 1, wherein each of the plurality of magnetic material pieces has one magnetic domain.

14. A magnetic random access memory (MRAM), comprising:
a first magnetic layer disposed over a substrate;
a first non-magnetic layer disposed over the first magnetic layer;
a second magnetic layer disposed over the first non-magnetic layer;
a second non-magnetic layer disposed over the second magnetic layer; and
a third non-magnetic layer disposed over the second non-magnetic layer, wherein:
the second magnetic layer includes a plurality of magnetic material pieces,
the plurality of magnetic material pieces are in direct contact with the first non-magnetic layer, and
each of the plurality of magnetic material pieces has a cross section shape of a tapered columnar shape having a width at a top smaller than a width at a bottom.

15. The MRAM of claim 14, wherein the plurality of magnetic material pieces are separated from each other by the second non-magnetic layer.

16. The MRAM of claim 14, wherein the second non-magnetic layer is made of a dielectric material.

17. The MRAM of claim 14, wherein the second non-magnetic layer is amorphous.

18. The MRAM of claim 14, wherein the second non-magnetic layer is crystalline or polycrystalline.

19. A semiconductor device including a magnetic random access memory (MRAM) cell, wherein the MRAM cell comprises:
a magnetic random access memory (MRAM) cell structure disposed over a substrate, the MRAM cell structure including a bottom electrode, a magnetic tunnel junction (MTJ) stack and a top electrode;
a first insulating cover layer covering sidewalls of the MRAM cell structure;
a second insulating cover layer disposed over the first insulating cover layer and made of a different material than the first insulating cover layer; and
a dielectric layer disposed over the MRAM cell structure and the second insulating cover layer,
wherein the MTJ stack includes:
a pinned magnetic layer disposed over the bottom electrode;
a tunneling barrier layer disposed over the pinned magnetic layer;
a free magnetic layer disposed over the tunneling barrier layer; and
a capping layer disposed over the free magnetic layer, and
the free magnetic layer includes a plurality of islands of magnetic material.

20. The semiconductor device of claim 19, wherein the capping layer is in direct contact with the tunneling barrier layer.

* * * * *